(12) United States Patent
Jung et al.

(10) Patent No.: US 11,380,224 B2
(45) Date of Patent: Jul. 5, 2022

(54) DISPLAY APPARATUS AND DISASSEMBLING METHOD THEREOF

(71) Applicant: SAMSUNG ELECTRONICS CO., LTD., Suwon-si (KR)

(72) Inventors: Jin Jung, Suwon-si (KR); Yoon Ah Kim, Suwon-si (KR); Sang Ki Yoon, Suwon-si (KR); Huu Lam Vuong Nguyen, Suwon-si (KR); Kwang Sung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 520 days.

(21) Appl. No.: 16/374,408

(22) Filed: Apr. 3, 2019

(65) Prior Publication Data
US 2020/0063767 A1 Feb. 27, 2020

Related U.S. Application Data

(60) Provisional application No. 62/721,785, filed on Aug. 23, 2018.

(30) Foreign Application Priority Data

Nov. 5, 2018 (KR) .......................... 10-2018-0134505

(51) Int. Cl.
*F16B 1/00* (2006.01)
*G09F 9/302* (2006.01)
(Continued)

(52) U.S. Cl.
CPC ............ *G09F 9/3026* (2013.01); *B25B 27/02* (2013.01); *F16B 1/00* (2013.01); *G09F 9/33* (2013.01);
(Continued)

(58) Field of Classification Search
CPC ........... G09F 9/33; G09F 9/335; G09F 9/3026
See application file for complete search history.

(56) References Cited

U.S. PATENT DOCUMENTS

2014/0003052 A1   1/2014   Hemiller et al.
2017/0159876 A1   6/2017   Brashnyk et al.
(Continued)

FOREIGN PATENT DOCUMENTS

CN   106448479 A      2/2017
CN   106973534 A  *   7/2017
(Continued)

OTHER PUBLICATIONS

Communication dated Mar. 13, 2019, issued by the Korean Intellectual Property Office in corresponding Korean Application No. 10-2018-0134505.
Communication dated May 28, 2021, issued by the European Patent Office in counterpart European Application No. 19850993.7.
Communication dated Jun. 18, 2021, issued by the State Intellectual Property Office of P.R. China in counterpart Chinese Application No. 201980005703.4.
(Continued)

*Primary Examiner* — Livius R. Cazan
(74) *Attorney, Agent, or Firm* — Sughrue Mion, PLLC

(57) ABSTRACT

A display apparatus, and a method for the display apparatus. The display apparatus includes a main frame, a magnet movably positioned on the main frame, and a light emitting diode (LED) module assembly detachably positioned on the main frame. The LED module assembly includes a plurality of LED modules, and a support frame on which the plurality of LED modules are installed, the support frame comprising a magnetic material interacting with the magnet. The display apparatus further includes a power cable configured to supply power to the plurality of LED modules, and a cover installed in the main frame to facilitate a connection of the power cable.

16 Claims, 21 Drawing Sheets

(51) Int. Cl.
  *G09F 9/33* (2006.01)
  *H05K 5/00* (2006.01)
  *H05K 7/02* (2006.01)
  *B25B 27/02* (2006.01)
  *H05K 5/03* (2006.01)

(52) U.S. Cl.
  CPC ............ *H05K 5/0017* (2013.01); *H05K 5/03* (2013.01); *H05K 7/02* (2013.01); *F16B 2001/0035* (2013.01)

(56) References Cited

U.S. PATENT DOCUMENTS

2018/0031919 A1* 2/2018 Ryu .............. H01F 7/0252
2020/0389987 A1* 12/2020 Kanno ............ G09F 9/3026

FOREIGN PATENT DOCUMENTS

| | | |
|---|---|---|
| CN | 207587303 U | 7/2018 |
| JP | 2018506748 A | 3/2018 |
| KR | 10-1149059 B1 | 5/2012 |
| KR | 10-2017-0143385 A | 12/2017 |
| KR | 10-2018-0011983 A | 2/2018 |
| WO | 2016208918 A1 | 12/2016 |

OTHER PUBLICATIONS

Communication dated Jun. 29, 2021, issued by the Japan Patent Office in counterpart Japanese Patent Application No. 2020-522856.
Communication dated Jul. 17, 2019, issued by the Korean Intellectual Property Office in corresponding Korean Application No. 10-2018-0134505.
International Search Report (PCT/ISA/210), issued by International Searching Authority in corresponding International Application No. PCT/KR2019/001918, dated Jun. 10, 2019.
Written Opinion (PCT/ISA/237) issued by the International Searching Authority in corresponding International Application No. PCT/KR2019/001918, dated Jun. 10, 2019.
Communication dated Sep. 9, 2020 issued by the State Intellectual Property Office of the P.R.China in application No. 201980005703.4.
Communication dated Oct. 21, 2020 issued by the European Patent Office in application No. 19850993.7.
Communication dated Feb. 2, 2021 issued by the Japanese Patent Office in application No. 2020-522856.
Communication dated Feb. 23, 2021 issued by the State Intellectual Property Office of the P.R.China in application No. 201980005703.4.

* cited by examiner

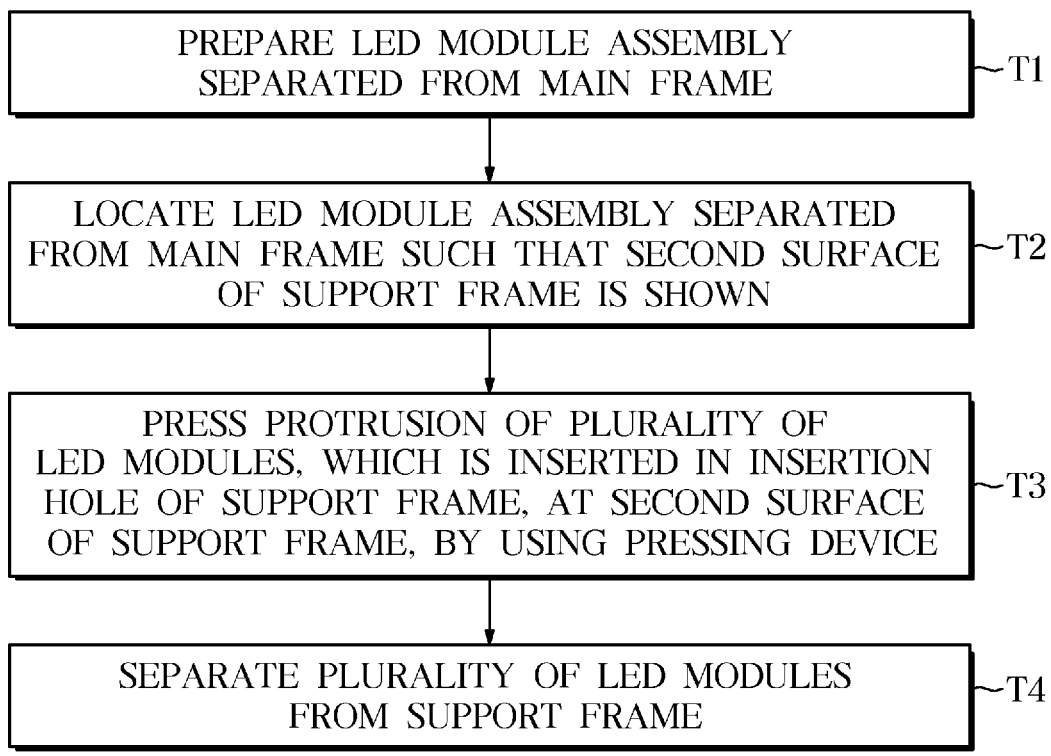

FIG.10

SECURE GAP BETWEEN EACH OF FIRST LED MODULE ASSEMBLY THAT IS TO BE SEPARATED AMONG PLURALITY OF FIRST LED MODULE ASSEMBLIES, ANOTHER FIRST LED MODULE ASSEMBLY NEIGHBORING FIRST LED MODULE ASSEMBLY THAT IS TO BE SEPARATED, AMONG PLURALITY OF FIRST LED MODULE ASSEMBLIES, AND PLURALITY OF SECOND LED MODULE ASSEMBLIES — P1

↓

LOCATE PROTECTION COVER IN GAP TO SURROUND AT LEAST ONE PART OF FIRST LED MODULE ASSEMBLY THAT IS TO BE SEPARATED — P2

↓

BRING MAGNET MEMBER HAVING FERROMAGNETISM CLOSE TO FIRST LED MODULE ASSEMBLY THAT IS TO BE SEPARATED, TO MOVE MAGNET POSITIONED ON FIRST MAIN FRAME AWAY FROM MAGNETIC MATERIAL POSITIONED ON FIRST LED MODULE ASSEMBLY THAT IS TO BE SEPARATED — P3

↓

SEPARATE, WHEN MAGNETIC MATERIAL POSITIONED ON FIRST LED MODULE ASSEMBLY THAT IS TO BE SEPARATED IS SEPARATED FROM MAGNET POSITIONED ON FIRST MAIN FRAME, FIRST LED MODULE ASSEMBLY THAT IS TO BE SEPARATED FROM FIRST MAIN FRAME — P4

↓

REMOVE PROTECTION COVER — P5

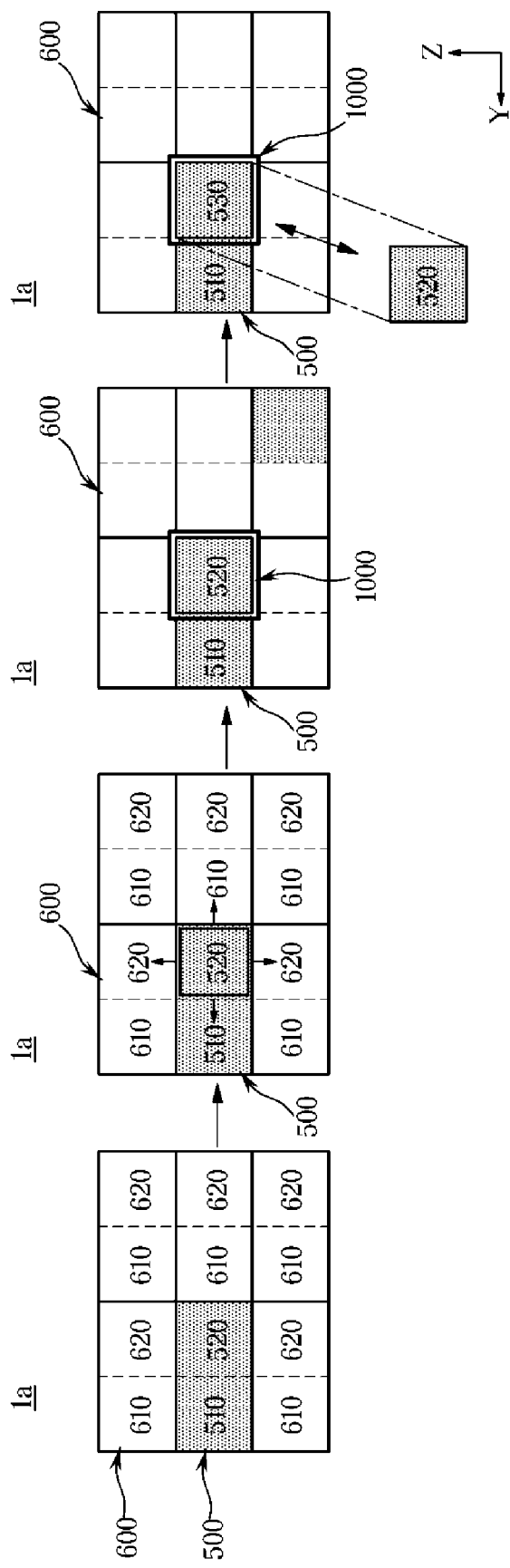

DISPLAY APPARATUS AND DISASSEMBLING METHOD THEREOF

CROSS-REFERENCE TO RELATED APPLICATION

This application is based on and claims priority under 35 U.S.C. § 119 to U.S. Patent Application No. 62/721,785, filed on Aug. 23, 2018 in the U.S. Patent and Trademark Office, and Korean Patent Application No. 10-2018-0134505, filed on Nov. 5, 2018 in the Korean Intellectual Property Office, the disclosures of which are incorporated by reference herein in its entirety.

BACKGROUND

1. Field

The present disclosure relates to a display apparatus and a disassembling method thereof, and more particularly, to a display apparatus having an improved structure that can be easily disassembled upon repair or inspection, and a method of disassembling the display apparatus.

2. Description of the Related Art

A display apparatus is a kind of output apparatus that visually displays images and data information, such as characters, figures, etc. Recently, needs for high brightness, high resolution, a large-screen, high efficiency, and low power of display apparatuses are increasing more and more. Accordingly, as a new display apparatus which will replace the Light Crystal Display (LCD) panel, an Organic Light Emitting Diode (OLED) panel is spotlighted. However, the OLED panel still has many problems that have to be solved, such as high price due to low yield, securing reliability according to enlargement, and securing durability against external environmental conditions such as water.

As a new product that can replace or complement the LCD and OLED panels, a panel manufactured by mounting inorganic light emitting devices of emitting light of Red (R), Green (G), and Blue (B) colors directly on a board is being studied.

When a display apparatus installed on an installation surface needs to be disassembled by reason of inspection or repair, a work of separating the display apparatus from the installation surface should be first performed. However, when the display apparatus is separated from the installation surface or when the display apparatus is disassembled for inspection or repair, the display apparatus may be damaged.

SUMMARY

Therefore, it is an aspect of the present disclosure to provide a display apparatus having an improved structure that can be disassembled for inspection or repair in the state of not being separated from an installation surface, and a method of disassembling the display apparatus.

It is another aspect of the present disclosure to provide a display apparatus having an improved structure that can be prevented from being damaged upon disassembly, and a method of disassembling the display apparatus.

Additional aspects of the disclosure will be set forth in part in the description which follows and, in part, will be obvious from the description, or may be learned by practice of the disclosure.

In accordance with an aspect of the present disclosure, there is provided a display apparatus including: a main frame; a magnet movably positioned on the main frame; and a light emitting diode (LED) module assembly detachably positioned on the main frame, wherein the LED module assembly includes: a plurality of LED modules; and a support frame on which the plurality of LED modules are installed, the support frame including a magnetic material interacting with the magnet. The display apparatus may further include: a power cable configured to supply power to the plurality of LED modules; and a cover installed in the main frame to facilitate a connection of the power cable.

When the magnet moves towards the magnetic material to be coupled with the magnetic material, the LED module assembly may be coupled with the main frame, and when the magnet moves away from the magnetic material to be separated from the magnetic material, the LED module assembly may be separated from the main frame.

The main frame may be provided with a magnet accommodating boss which extends toward the LED module assembly and in which the magnet is movably accommodated.

The LED module assembly may further include a coupling member configured to couple the plurality of LED modules with the support frame.

The plurality of LED modules may include a protrusion formed on one surfaces of the plurality of LED modules facing the support frame.

The support frame may include an insertion hole in which the protrusion is inserted.

A thread may be formed in an inner circumferential surface of the insertion hole.

In accordance with another aspect of the present disclosure, there is provided a method of disassembling a display apparatus, the display apparatus including a main frame and a LED module assembly positioned on the main frame, the method including: bringing a magnet member having ferromagnetism close to the LED module assembly fixed on the main frame by coupling between a magnet positioned on the main frame and a magnetic material positioned on the LED module assembly to move the magnet positioned on the main frame away from the magnetic material positioned on the LED module assembly; separating the LED module assembly from the main frame when the magnetic material positioned on the LED module assembly moves away from the magnet positioned on the main frame; and separating the separated LED module assembly to a plurality of LED modules and a support frame.

The separating of the LED module assembly may include separating the plurality of LED modules coupled with a front surface of the support frame by a coupling member from the support frame.

The separating of the LED module assembly may include: locating the LED module assembly separated from the main frame such that a rear surface of the support frame is shown; and pressing a protrusion of the plurality of LED modules, the protrusion inserted in an insertion hole of the support frame, from the rear surface of the support frame, by using a pressing device.

The pressing of the protrusion of the plurality of LED modules by using the pressing device may include rotating the pressing device in the state in which a first thread of the pressing device is engaged with a second thread formed in an inner circumferential surface of the insertion hole to thereby press the protrusion of the plurality of LED modules.

The method may further include separating a cover from the main frame to access a power cable positioned behind the main frame to supply power to the LED module assembly.

The separating of the cover from the main frame may include pressing an operating portion formed in one side of the cover in an inward direction of the cover to separate the cover from a locking portion formed in the main frame.

The separating of the cover from the main frame may further include separating the other side of the cover from a holding portion formed in the main frame to completely separate the cover from the main frame.

In accordance with another aspect of the present disclosure, there is provided a method of disassembling a display apparatus, the display apparatus including a first unit including a first main frame and a plurality of first LED module assemblies positioned on the first main frame and a plurality of second units including a second main frame and a plurality of second LED module assemblies positioned on the second main frame, wherein the plurality of second units neighbor the first unit, the method including: securing a gap between each of a first LED module assembly that is to be separated among the plurality of first LED module assemblies, another first LED module assembly neighboring the first LED module assembly that is to be separated among the plurality of first LED module assemblies, and the plurality of second LED module assemblies; locating a protection cover in the gap to surround at least one part of the first LED module assembly that is to be separated; and separating the first LED module assembly that is to be separated, from the first main frame.

The locating of the protection cover in the gap may include detachably coupling the protection cover with the plurality of second LED module assemblies and the other first LED module assembly neighboring at least one part of the first LED module assembly that is to be separated.

The locating of the protection cover in the gap may include coupling the protection cover with the plurality of second LED module assemblies and the other first LED module assembly neighboring at least one part of the first LED module assembly that is to be separated, by using a magnetic force.

Each of the plurality of first LED module assemblies and the plurality of second LED module assemblies may include a protrusion, wherein the coupling of the protection cover with the plurality of second LED module assemblies and the other first LED module assembly neighboring the at least one part of the first LED module assembly that is to be separated may include coupling a magnet of the protection cover with the protrusion of the other first LED module assembly and coupling the magnet of the protection cover with the protrusion of the plurality of second LED module assemblies to couple the protection cover with the other first LED module assembly and the plurality of second LED module assemblies, thereby covering at least one part of the other first LED module assembly and at least one part of the plurality of second LED module assemblies with the protection cover.

A magnet may be positioned on the first main frame, a magnetic material may be positioned on the plurality of first LED module assemblies, and the method may further include bringing a magnet member having ferromagnetism close to the first LED module assembly that is to be separated to move the magnet positioned on the first main frame away from the magnetic material positioned on the first LED module assembly that is to be separated.

In an embodiment of the present disclosure, a display apparatus comprises a main frame, a magnet movably positioned on the main frame, and a light emitting diode (LED) module assembly detachably positioned on the main frame. The LED module assembly comprises a plurality of LED modules, and a support frame on which the plurality of LED modules are installed, the support frame comprising a magnetic material interacting with the magnet. The display apparatus further comprises a power cable configured to supply power to the plurality of LED modules, and a cover installed in the main frame to facilitate a connection of the power cable.

In an embodiment of the present disclosure, a method is provided for disassembling a display apparatus, the display apparatus including a main frame and a LED module assembly positioned on the main frame by a magnet positioned on the main frame being magnetically coupled with a magnetic material positioned on the LED module assembly. The method comprises bringing a magnet member, having ferromagnetism, close to the LED module assembly fixed on the main frame such that the magnet positioned on the main frame moves away from the magnetic material positioned on the LED module assembly; separating the LED module assembly from the main frame while the magnetic material positioned on the LED module assembly is moved away from the magnet positioned on the main frame; and separating, after the LED module assembly is separated from the main frame, a plurality of LED modules of the LED module assembly from a support frame of the LED module assembly. In an embodiment of the present disclosure, a method is provided for disassembling a display apparatus, the display apparatus including a first unit including a first main frame and a plurality of first LED module assemblies positioned on the first main frame, and the display apparatus further including a plurality of second units, each second unit in the plurality of second units including a second main frame and a plurality of second LED module assemblies positioned on the second main frame, wherein the plurality of second units neighbor the first unit. The method comprises securing a gap between each of a first LED module assembly of the plurality of first LED module assemblies that is to be separated, another first LED module assembly of the plurality of first LED module assemblies neighboring the first LED module assembly that is to be separated, and at least one of the plurality of second LED module assemblies of at least one second unit of the plurality of second units; providing a protection cover in the gap such that the protection cover surrounds at least one part of the first LED module assembly that is to be separated; and separating the first LED module assembly that is to be separated, from the first main frame.

In an embodiment of the present disclosure, a display apparatus comprises a main frame, a magnet movably positioned on the main frame, and a light emitting diode (LED) module assembly detachably positioned on the main frame. The LED module assembly comprises a LED module, and a support frame on which the LED module is installed, the support frame including a magnetic material interacting with the magnet.

BRIEF DESCRIPTION OF THE DRAWINGS

These and/or other aspects of the disclosure will become apparent and more readily appreciated from the following description of the embodiments, taken in conjunction with the accompanying drawings of which:

FIG. 8 is a block diagram for describing a process of disassembling a display apparatus according to an embodiment of the present disclosure to separate a plurality of LED modules of the display apparatus from a support frame;

FIG. 10 is a block diagram for describing a process of disassembling a display apparatus according to another embodiment of the present disclosure to separate any one of a plurality of LED module assemblies from a main frame;

FIG. 11 schematically shows a process of disassembling the display apparatus of FIG. 10;

DETAILED DESCRIPTION

Hereinafter, embodiments of the present disclosure will be described in detail with reference to the accompanying drawings. In the following description, the terms "front end", "rear end", "upper portion", "lower portion", "upper end", and "lower end", when used in this specification, are defined based on the drawings, and the shapes and locations of the corresponding components are not limited by the terms.

Figure 1:
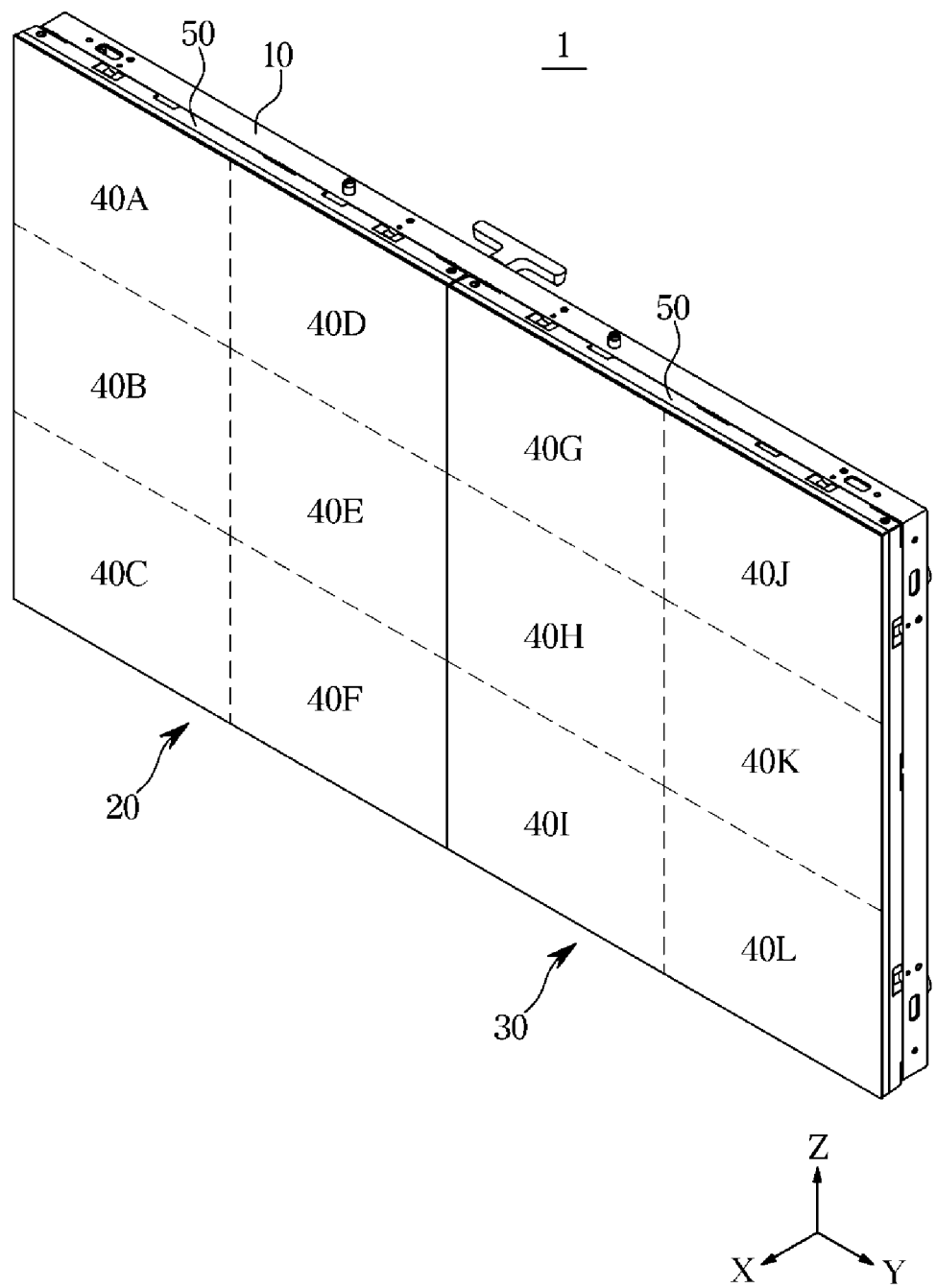
FIG. 1 is a perspective view of a display apparatus according to an embodiment of the present disclosure.

FIG. 1 is a perspective view of a display apparatus according to an embodiment of the present disclosure. In FIG. 1, "X" represents a front-rear direction of the display apparatus, "Y" represents a left-right direction of the display apparatus, and "Z" represents a up-down direction of the display apparatus.

As shown in FIG. 1, a display apparatus 1, which is an apparatus for displaying information and data as characters, figures, graphs, images, etc., may be a television (TV), a personal computer (PC), a mobile device, a digital signage, etc. The display apparatus 1 may be installed on a ground by a stand (not shown) or on a wall.

The display apparatus 1 may include a main frame 10 (e.g. a cabinet), and a plurality of Light Emitting Diode (LED) module assemblies 20 and 30 installed on the main frame 10. Each of the plurality of LED module assemblies 20 and 30 may include a support frame 50 positioned on the main frame 10, and a plurality of LED modules 40A to 40L installed on the support frame 50. More specifically, any one LED module assembly of the plurality of LED module assemblies 20 and 30 may include a plurality of LED modules 40A to 40F, and the other LED module assembly of the plurality of LED module assemblies 20 and 30 may include a plurality of LED modules 40G to 40L. For example, in an embodiment of the present disclosure, the LED module assembly 20 may include the plurality of LED modules 40A to 40F, and the LED module assembly 30 may include the plurality of LED modules 40G to 40L.

The main frame 10 may form a part of an outer appearance of the display apparatus 1. The main frame 10 may include a main frame body 11 (see FIG. 2) forming a rear outer appearance of the display apparatus 1, and an edge portion 12 (see FIG. 2) extending from the main frame body 11 in a front direction of the display apparatus 1. The plurality of LED modules 40A to 40L installed on the support frame 50 may implement a screen of the display apparatus 1.

The plurality of LED modules 40A to 40L may be arranged in the form of a M*N matrix in up, down, left, and right directions to be adjacent to each other. In the current embodiment, 12 LED modules 40A to 40L may be installed in the form of a 3*4 matrix on the support frame 50. However, the number and arrangement of the LED modules 40A to 40L are not limited to this example, and may change variously. In the current embodiment, the plurality of LED modules 40A to 40L may be installed on two support frames 50. More specifically, a part 40A to 40F of the plurality of LED modules 40A to 40L may be installed on the support frame 50 of any one LED module assembly of the plurality of LED module assemblies 20 and 30, and the other part 40G to 40L may be installed on the support frame 50 of the other LED module assembly of the plurality of LED module assemblies 20 and 30. For example, in an embodiment of the present disclosure, the part 40A to 40F of the plurality of LED modules 40A to 40L may be installed on the support frame 50 of the LED module assembly 20, and the other part 40G to 40L may be installed on the support frame 50 of the LED module assembly 30. However, the number of the support frames 50 is not limited to this example, and may change variously.

An edge portion 52 (see FIG. 2) of each support frame 50 may be positioned on the main frame 10 and exposed to the outside. The edge portion 52 of the support frame 50 may form upper, lower, and side appearances of the display apparatus 1, together with the edge portion 12 of the main frame 10. In the current embodiment, the support frame 50 may be positioned on the main frame 10 and exposed to the outside of the display apparatus 1. However, the support frame 50 may be positioned on the main frame 10 without being exposed to the outside of the display apparatus 1.

The plurality of LED modules 40A to 40L may have a flat shape or a curved shape. Also, the curvature of the plurality of LED modules 40A to 40L may change.

Figure 2:
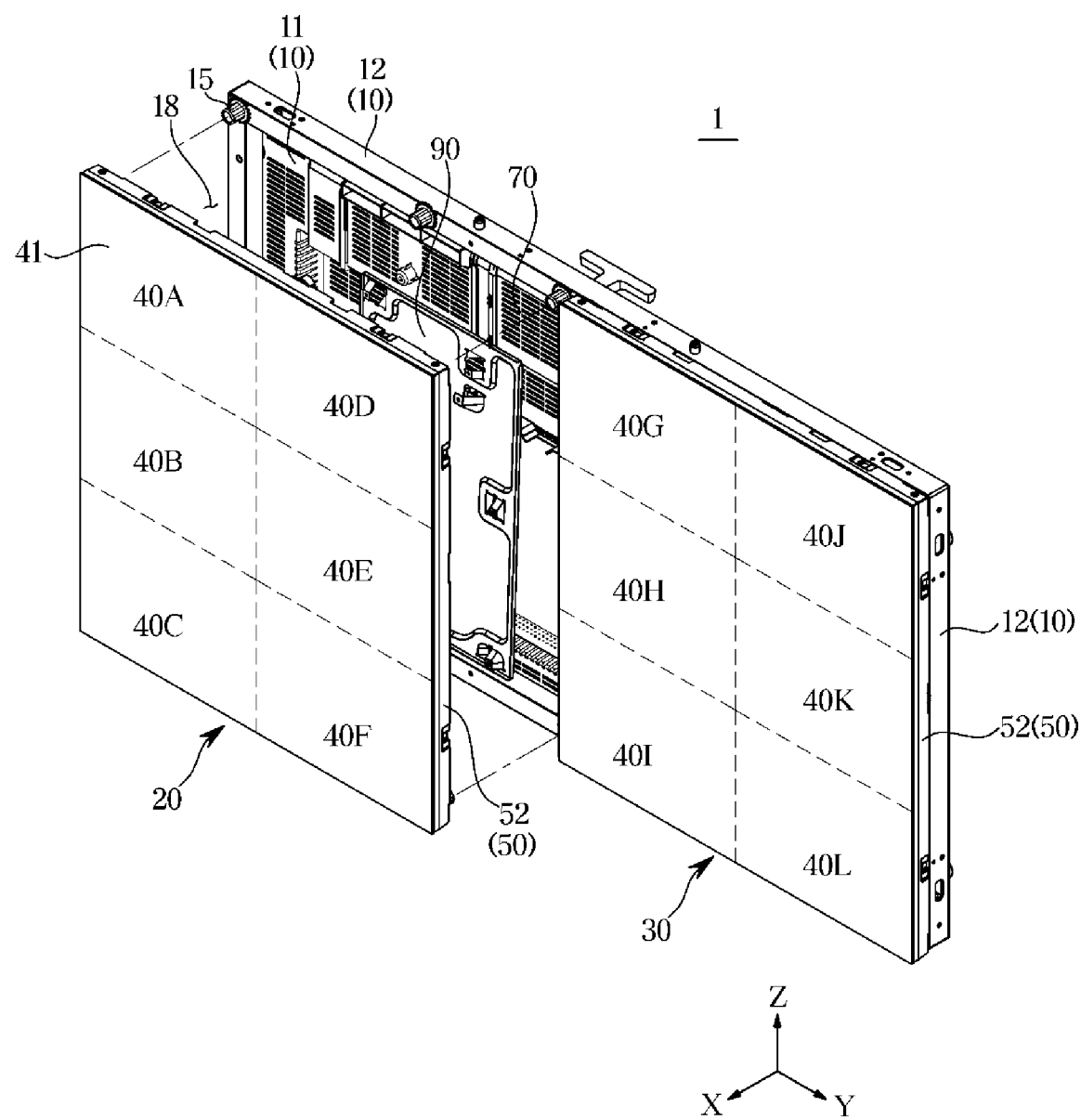
FIG. 2 is a perspective view of a display apparatus according to an embodiment of the present disclosure, when a Light Emitting Diode (LED) module assembly is separated from a main frame.

FIG. 2 is a perspective view of a display apparatus according to an embodiment of the present disclosure, when a LED module assembly is separated from a main frame.

As shown in FIG. 2, the plurality of LED module assemblies 20 and 30 may be separated from the main frame 10. In other words, the plurality of LED module assemblies 20 and 30 may be detachably coupled with the main frame 10.

The display apparatus 1 may further include a magnet 60 (see FIG. 7C) movably positioned on the main frame 10. The plurality of LED module assemblies 20 and 30 may be detachably coupled with the main frame 10 by a magnetic force (e.g. a magnetically attractive force). More specifically, the plurality of LED module assemblies 20 and 30 may be detachably coupled with the main frame 10 by an interaction between a magnetic material 55 positioned on the plurality of LED module assemblies 20 and 30 and the magnet 60 positioned on the main frame 10. The magnet 60 positioned on the main frame 10 may be movably accommodated in a magnet accommodating boss 15 of the main frame 10. More specifically, the magnet 60 may be accommodated in the magnet accommodating boss 15 of the main frame 10 in such a way to be movable in the front-rear direction X of the display apparatus 1.

When the magnet 60 moves towards the magnetic material 55 positioned on the plurality of LED module assemblies 20 and 30 to be coupled with the magnetic material 55, the plurality of LED module assemblies 20 and 30 may be coupled with the main frame 10. Meanwhile, when the magnet 60 moves away from the magnetic material 55 positioned on the plurality of LED module assemblies 20 and 30 to be separated from the magnetic material 55, the plurality of LED module assemblies 20 and 30 may be separated from the main frame 10.

As described from another aspect, when the magnet 60 moves in the front direction of the display apparatus 1 to move close to the magnetic material 55 positioned on the plurality of LED module assemblies 20 and 30, the plurality of LED module assemblies 20 and 30 may be coupled with the main frame 10. Meanwhile, when the magnet 60 moves in a rear direction of the display apparatus 1 to move away from the magnetic material 55 positioned on the plurality of LED module assemblies 20 and 30, the plurality of LED module assemblies 20 and 30 may be separated from the main frame 10.

In the main frame 10, the magnet accommodating boss 15 may be provided. In an embodiment, in the main frame 10, a plurality of magnetic accommodating bosses 15 may be provided. The magnet accommodating bosses 15 may be positioned on the edge portion 12 of the main frame 10 towards the front direction of the display apparatus 1. Each magnet accommodating boss 15 may extend in the front-rear direction X of the display apparatus 1 such that the magnet 60 can move in the front-rear direction of the display apparatus 1 in the inside of the magnetic accommodating boss 15. In other words, the magnet accommodating boss 15 may extend towards the LED module assemblies 20 and 30 with a predetermined length in the front-rear direction X of the display apparatus 1. The magnet accommodating boss 15 may be installed on the edge portion 12 of the main frame 10, as a component that is separated from the main frame 10. However, the magnet accommodating boss 15 may be integrated into the main frame 10. When the magnet accommodating boss 15 is integrated into the main frame 10, the magnet accommodating boss 15 may extend towards the LED module assemblies 20 and 30 from the edge portion 12 of the main frame 10.

A cover 70 may be detachably coupled with the main frame 10 to facilitate access to a power cable 80. The cover 70 may be detachably coupled with the main frame body 11 to facilitate an access to the power cable 80 located behind the main frame 10. The cover 70 will be described in more detail, later.

The display apparatus 1 may further include an accommodating space 18 defined by the main frame 10 and the plurality of LED module assemblies 20 and 30 detachably coupled with the main frame 10. The accommodating space 18 may be formed between the main frame 10 and the plurality of LED module assemblies 20 and 30 detachably coupled with the main frame 10.

The display apparatus 1 may further include a control board 90 for driving the plurality of LED modules 40A to 40L. The control board 90 may be positioned in the accommodating space 18. When the control board 90 needs to be repaired or inspected, a repairer or inspector may easily access the control board 90 by separating the plurality of LED module assemblies 20 and 30 from the main frame 10 without having to disassemble the entire of the display apparatus 1.

Figure 3:
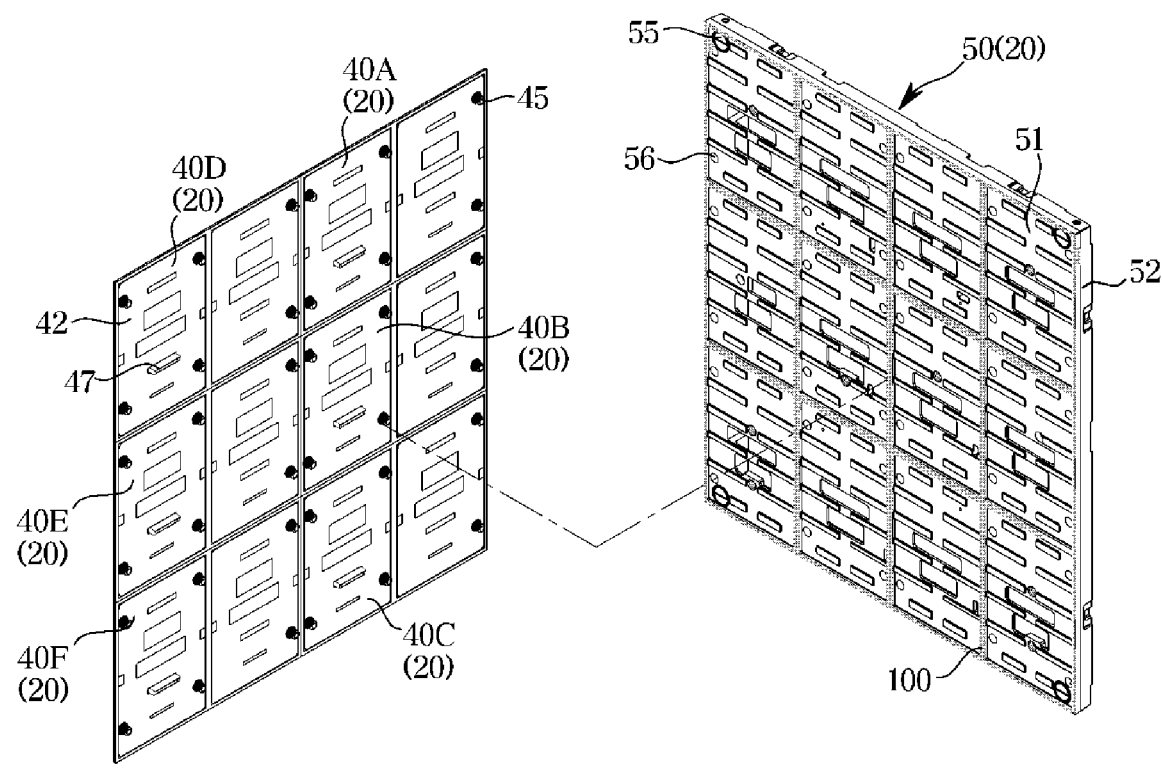
FIG. 3 is an exploded perspective view of a LED module assembly of a display apparatus according to an embodiment of the present disclosure.
Figure 4:
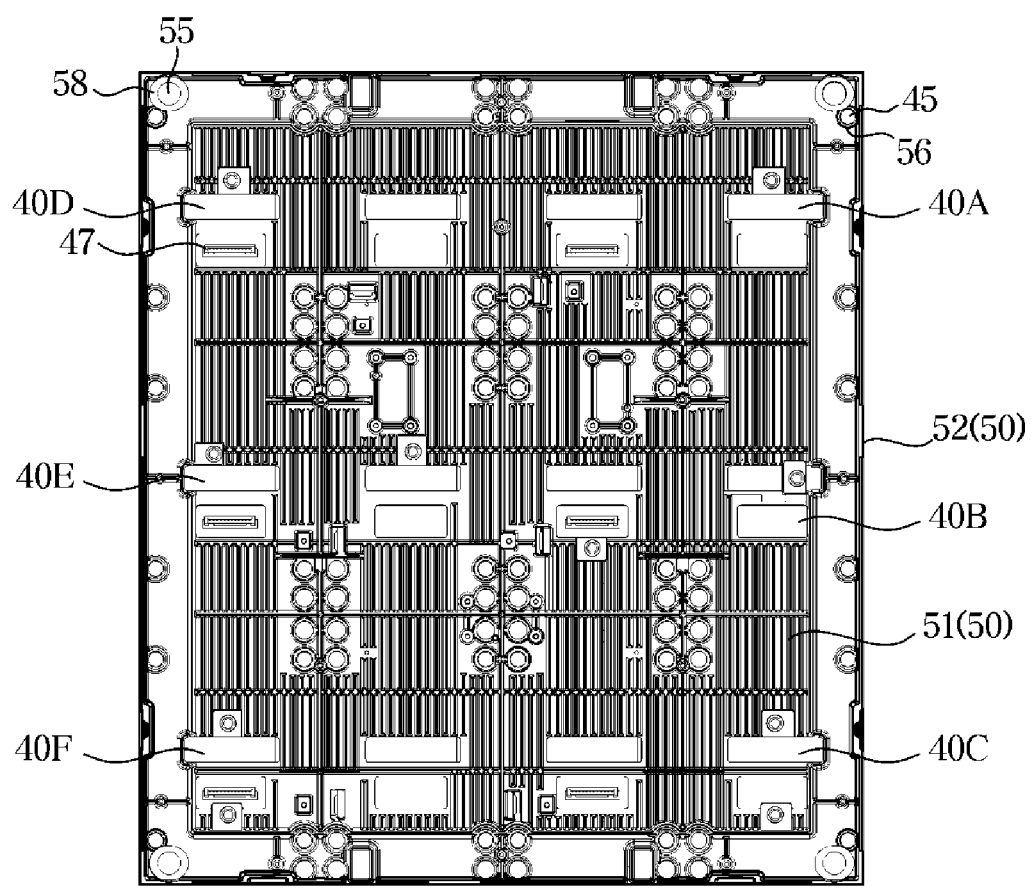
FIG. 4 is a rear view of a LED module assembly of a display apparatus according to an embodiment of the present disclosure.
Figure 5A:
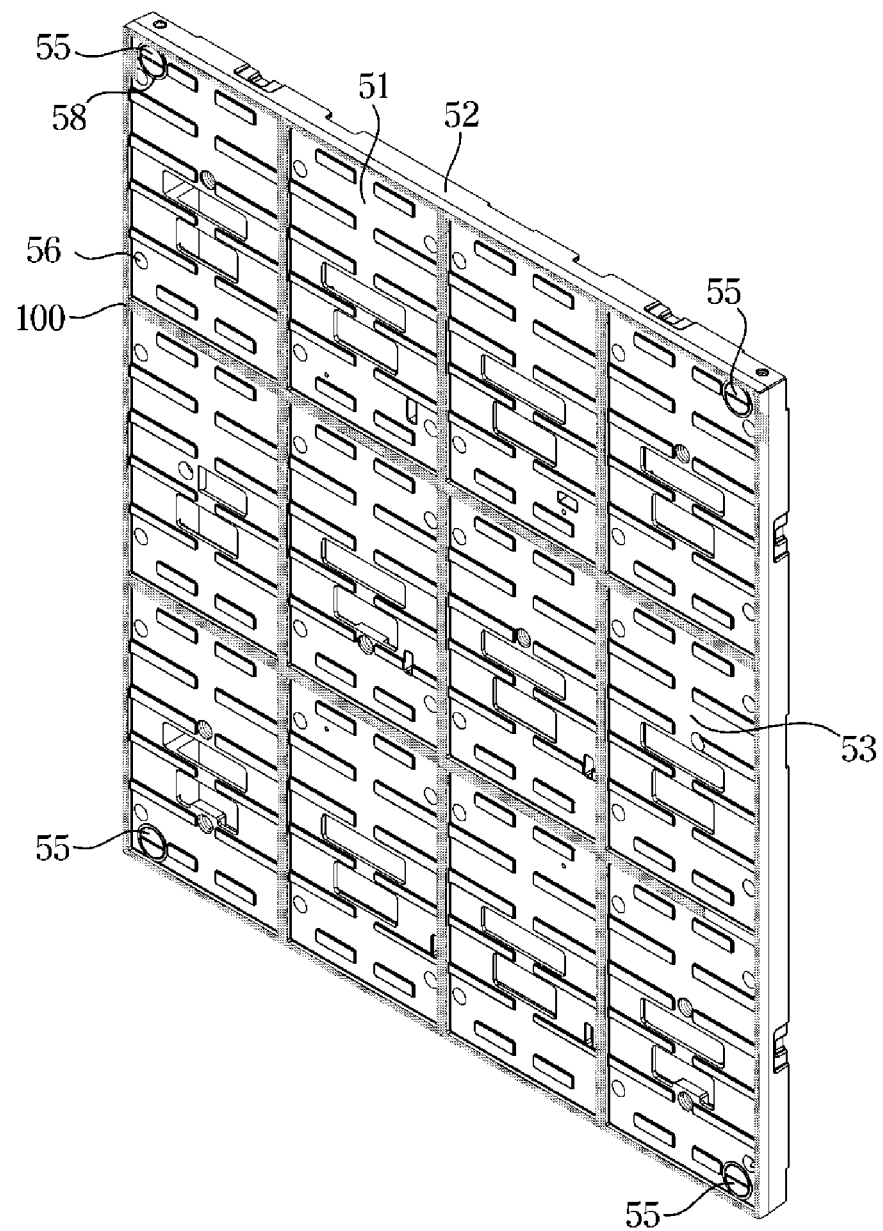
FIG. 5A is a front perspective view of a support frame of a LED module assembly in a display apparatus according to an embodiment of the present disclosure.
Figure 5B:
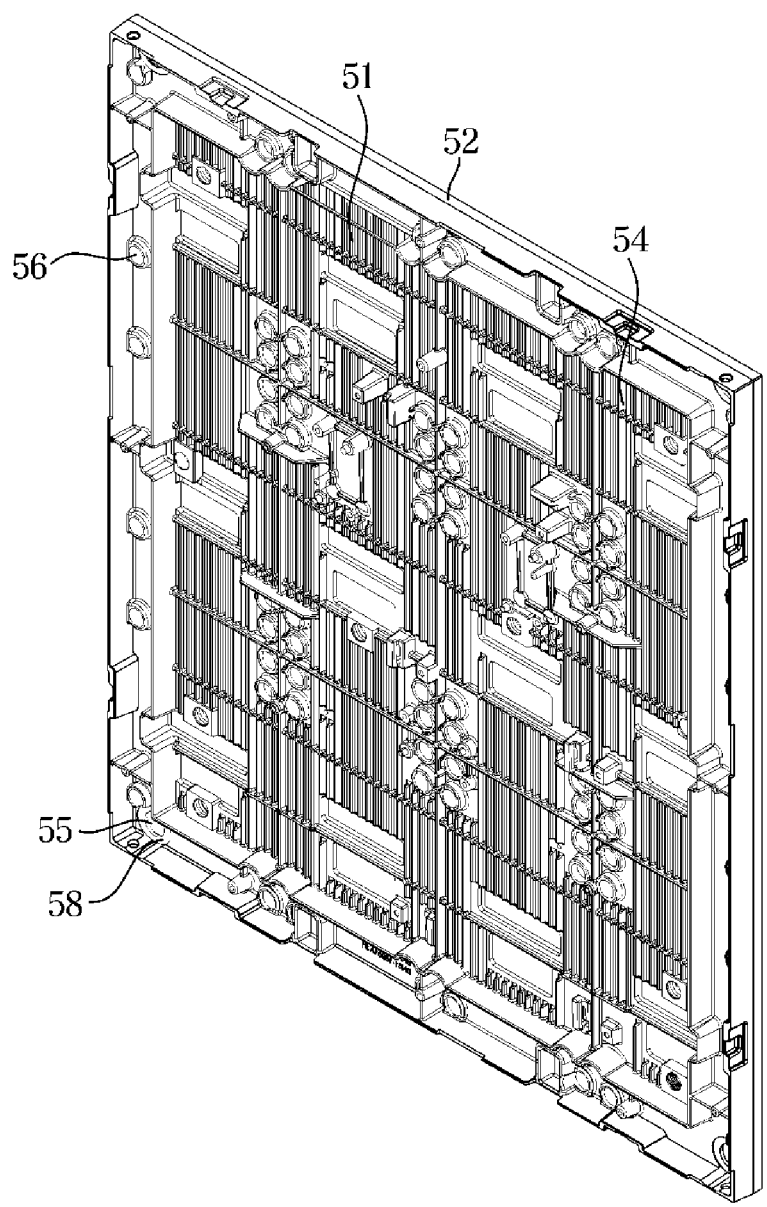
FIG. 5B is a rear perspective view of a support frame of a LED module assembly in a display apparatus according to an embodiment of the present disclosure.

FIG. 3 is an exploded perspective view of a LED module assembly of a display apparatus according to an embodiment of the present disclosure, FIG. 4 is a rear view of a LED module assembly of a display apparatus according to an embodiment of the present disclosure, FIG. 5A is a front perspective view of a support frame of a LED module assembly in a display apparatus according to an embodiment of the present disclosure, and FIG. 5B is a rear perspective view of a support frame of a LED module assembly in a display apparatus according to an embodiment of the present disclosure.

As shown in FIGS. 3 to 5B, the plurality of LED modules 40A to 40F may be installed on the LED module assembly 20, and the plurality of LED module assembly 20 may include the support frame 50 including the magnetic material 55 that interacts with the magnet 60 accommodated in the inside of the magnet accommodating boss 15. It is understood, based on FIGS. 3 to 5B, that the plurality of LED modules 40A to 40L may be installed on the plurality of LED module assemblies 20 and 30, and each of the plurality of LED module assemblies 20 and 30 may include the support frame 50 including the magnetic material 55 that interacts with the magnet 60 accommodated in the inside of the magnet accommodating boss 15.

Each of the plurality of LED module assemblies 20 and 30 may further include a coupling member 100 for coupling the plurality of LED modules 40A to 40L with the support frame 50. According to an example, the coupling member 100 may be a double-sided tape. However, the coupling member 100 is not limited to a double-sided tape. The coupling member 100 may be positioned between the plurality of LED modules 40A to 40L and the support frame 50 to couple the plurality of LED modules 40A to 40L with the support frame 50.

Each of the plurality of LED modules 40A to 40L may include a first surface 41 (see FIG. 2) forming a screen of the display apparatus 1, and a second surface 42 that is opposite to the first surface 41 and faces the support frame 50.

The plurality of LED modules 40A to 40L may further include a protrusion 45 formed on one surface of the plurality of LED modules 40A to 40L facing the support frame 50. In other words, the plurality of LED modules 40A to 40L may include the protrusion 45 formed on the second surface 42 of the plurality of LED modules 40A to 40L. The protrusion 45 may be formed on the second surface 42 of at least one of the plurality of LED modules 40A to 40L. The protrusion 45 of the plurality of LED modules 40A to 40L may be inserted in an insertion hole 56 of the support frame 50. For example, the protrusion 45 may be made of metal. For example, six protrusions 45 may be formed on one surface of each LED module 40A to 40L. However, the number of the protrusions 45 is not limited to the example, and may change variously.

The plurality of LED modules 40A to 40L may be electrically connected to the control board 90. The plurality of LED modules 40A to 40L may further include a connector 47 formed on the second surfaces 42 to be electrically connected to the control board 90.

The support frame 50 may include a support frame body 51, and the edge portion 52 extending from the support frame body 51 towards the rear direction of the display apparatus 1. The support frame 50 may include a first surface 53 facing the plurality of LED modules 40A to 40L, and a second surface 54 that is opposite to the first surface 53 and faces the main frame body 11. The plurality of LED modules 40A to 40L may be bonded or coupled on the first surface 53 of the support frame 50 by the coupling member 100. The first surface 53 of the support frame 50 may be a front surface of the support frame 50.

The support frame 50 may further include a magnetic material coupling portion 58 with which the magnetic material 55 is coupled. The magnetic material 55 may be coupled with the magnetic material coupling portion 58 of the support frame 50. In an embodiment of the present disclosure, the magnetic material coupling portion 58 may be formed at a corner of the support frame 50. The magnetic material 55 may be coupled with the magnetic material coupling portion 58 such that one end of the magnetic material 55 faces the plurality of LED modules 40A to 40L and the other end of the magnetic material 55 interacts with the magnet 60 positioned on the main frame 10.

The support frame 50 may further include the insertion hole 56 in which the protrusion 45 of the plurality of LED modules 40A to 40L is inserted. The insertion hole 56 may be formed in the support frame body 51. In an inner circumferential surface of the insertion hole 56, a thread 56a (see FIG. 9B) may be formed. The number and location of the insertion hole 56 may correspond to the number and location of the protrusion 45.

The display apparatus 1 may further include a power cable 80 (see FIG. 7C) for supplying power to the plurality of LED modules 40A to 40L. The power cable 80 may be connected to a power supply (not shown) to supply power to the plurality of LED modules 40A to 40L. The power cable 80 may be located behind the display apparatus 1. In other words, the power cable 80 may be located behind the main frame 10.

The display apparatus 1 may further include the cover 70 (see FIG. 2) installed in the main frame 10 to facilitate a connection of the power cable 10. The cover 70 may be detachably installed in the main frame 10. In the main frame body 11, an opening 11a (see FIG. 7D) may be formed to correspond to the power cable 80, and the cover 70 may be installed in the main frame body 11 to open or close the opening 11a. The cover 70 may include an operating portion 71 (see FIG. 7E) and a coupling groove 72 (see FIG. 7E). More specifically, the operating portion 71 may be formed on one side of the cover 70 in such a way to be elastically deformable, and the coupling groove 72 may be formed on the other side of the cover 70. In the main frame body 11 in which the cover 70 is installed, a locking portion 11b (see FIG. 7E) interacting with the operating portion 71 of the cover 70, and a holding portion 11c (see FIG. 7E) coupled with the coupling groove 72 of the cover 70 to hold the cover 70 may be formed. The cover 70 may be completely separated from the main frame body 11. When the operating portion 71 of the cover 70 is engaged with the locking portion 11b of the main frame body 11, and the holding portion 11c of the main frame body 11 is coupled with the coupling groove 72 of the cover 70 to hold the cover 70, the opening 11a of the main frame body 11 may be maintained in a closed state by the cover 70. When the operating portion 71 of the cover 70 is pressed in an inward direction of the cover 70 to be spaced from the locking portion 11b of the main frame body 11, and the holding portion 11c of the main frame body 11 is separated from the coupling groove 72 of the cover 70, the cover 70 may be separated from the main frame body 11 so that the opening 11a of the main frame body 11 may be maintained in an open state.

In an embodiment, when an access to a power cable is needed, it may be necessary to separate a display apparatus from an installation surface and then dissemble the display apparatus. However, according to the current embodiment in which the opening 11a is formed in the main frame body 11 and the cover 70 for opening or closing the opening 11a is provided, access to the power cable 80 is possible without having to separate the display apparatus 1 from the installation surface to disassemble the display apparatus 1. Also, by forming a slit in the cover 70, foreign materials may be prevented from entering the accommodating space 18, and also heat generated from the control board 90, etc. may be discharged to the outside of the display apparatus 1 through the slit formed in the cover 70.

In the current embodiment, a case in which the cover 70 is completely separated from the main frame body 11 is described. However, the cover 70 may have another structure as long as it can open or close the opening 11a to allow an access to the power cable 80. For example, the cover 70 may be rotatably installed in the main frame body 11 to open or close the opening 11a.

Figure 6:
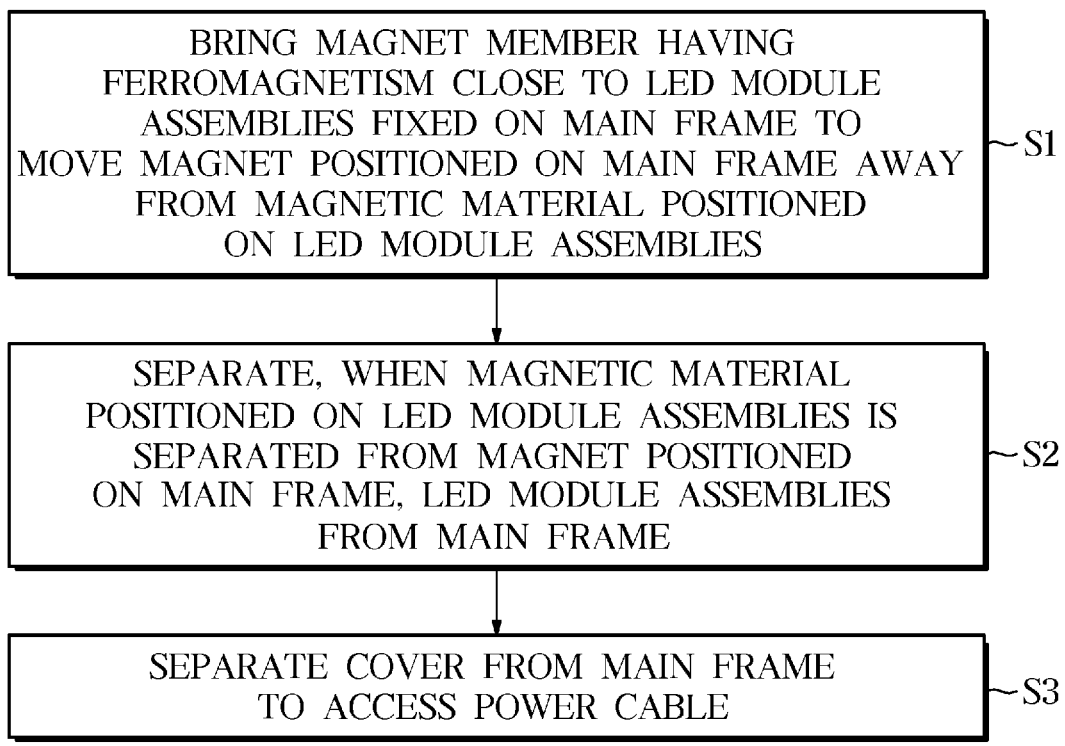
FIG. 6 is a block diagram for describing a process of disassembling a display apparatus according to an embodiment of the present disclosure to connect or disconnect a power cable of the display apparatus.

FIG. 6 is a block diagram for describing a process of disassembling a display apparatus according to an embodiment of the present disclosure to connect or disconnect a power cable of the display apparatus, and FIGS. 7A to 7E show a process of disassembling a display apparatus according to an embodiment of the present disclosure to connect or disconnect a power cable of the display apparatus.

As shown in FIG. 6, a method of disassembling a display apparatus may include operation S1 of bringing a magnet member having ferromagnetism close to LED module assemblies attached to a main frame to move a magnet positioned on the main frame away from a magnetic material positioned on the LED module assemblies.

The method of disassembling the display apparatus may further include operation S2 of separating, when the magnetic material positioned on the LED module assemblies is separated from the magnet positioned on the main frame, the LED module assemblies from the main frame.

The method of disassembling the display apparatus may further include operation S3 of separating a cover from the main frame to access a power cable. Operation S3 of separating the cover from the main frame may include operation of pressing an operating portion formed in one side of the cover in an inward direction of the cover to separate the cover from a locking portion formed in the main frame. Operation S3 of separating the cover from the main frame may further include operation of separating the other side of the cover from a holding portion formed in the main frame to completely separate the cover from the main frame.

Hereinafter, a process of disassembling the display apparatus 1 will be described with reference to FIGS. 7A to 7E.

Figure 7A:
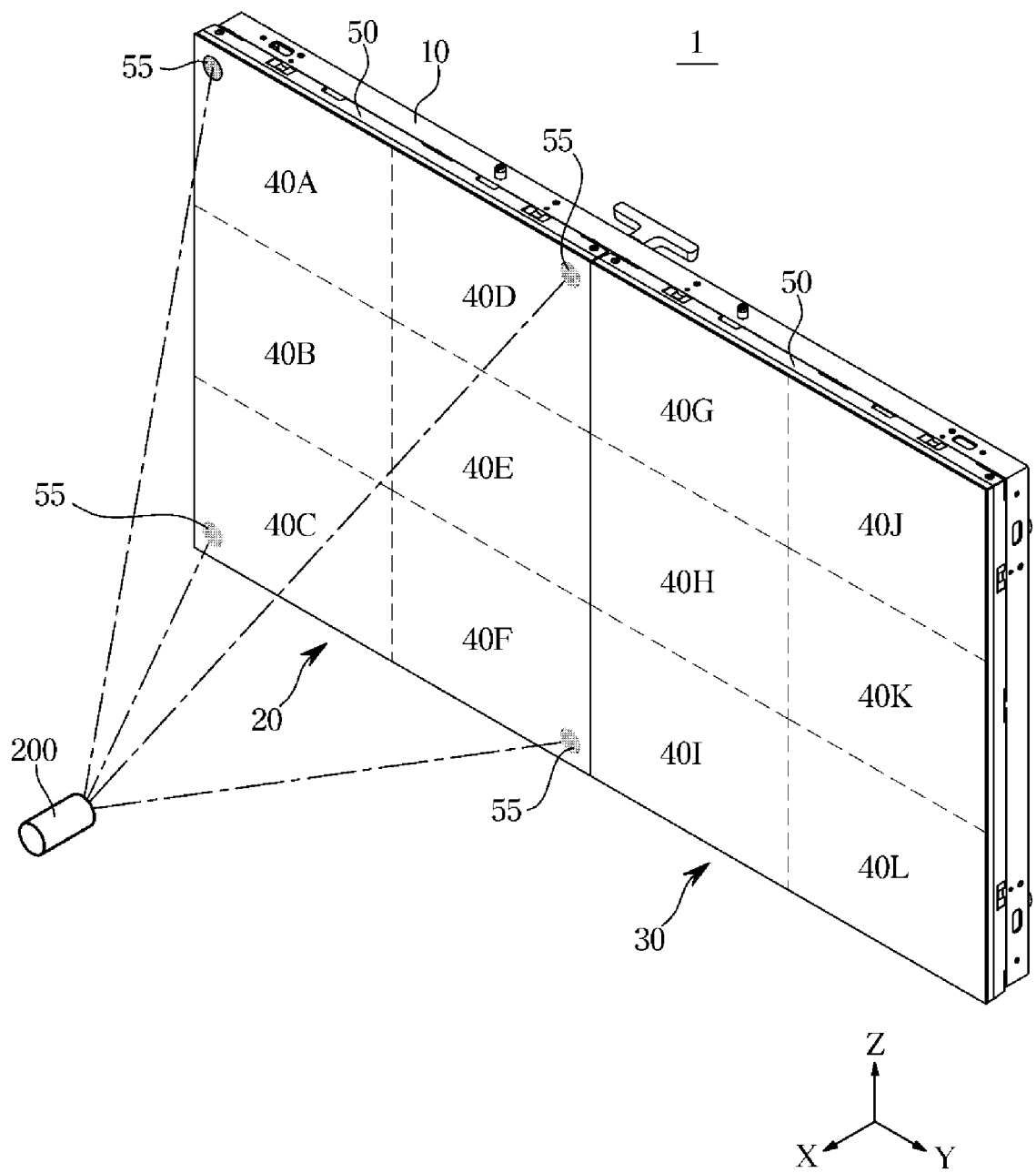
FIGS. 7A to 7E show a process of disassembling a display apparatus according to an embodiment of the present disclosure to connect or disconnect a power cable of the display apparatus.

As shown in FIG. 7A, when any one LED module assembly of the plurality of LED module assemblies 20 and 30, coupled with the main frame 10 by coupling between the magnet 60 positioned on the main frame 10 and the magnetic material 55 positioned on the plurality of LED module assemblies 20 and 30, is to be separated from the main frame 10, a magnet member 200 having ferromagnetism may be brought close to the LED module assembly 20. The magnet member 200 may have stronger magnetism than the magnet 60 positioned on the main frame 10. When the magnet member 200 is brought close to a location corresponding to the magnetic material 55 positioned on the LED module assembly 20 that is to be separated, a repulsive force may act between the magnet member 200 and the magnet 60 positioned on the main frame 10 so that the magnet 60 may be separated from the magnetic material 55. That is, the magnet 60 may move towards the rear direction of the display apparatus 1 by the repulsive force acting between the magnet member 200 and the magnet 60, and accordingly, coupling between the magnetic material 55 and the magnet 60 may be released.

Figure 7B:
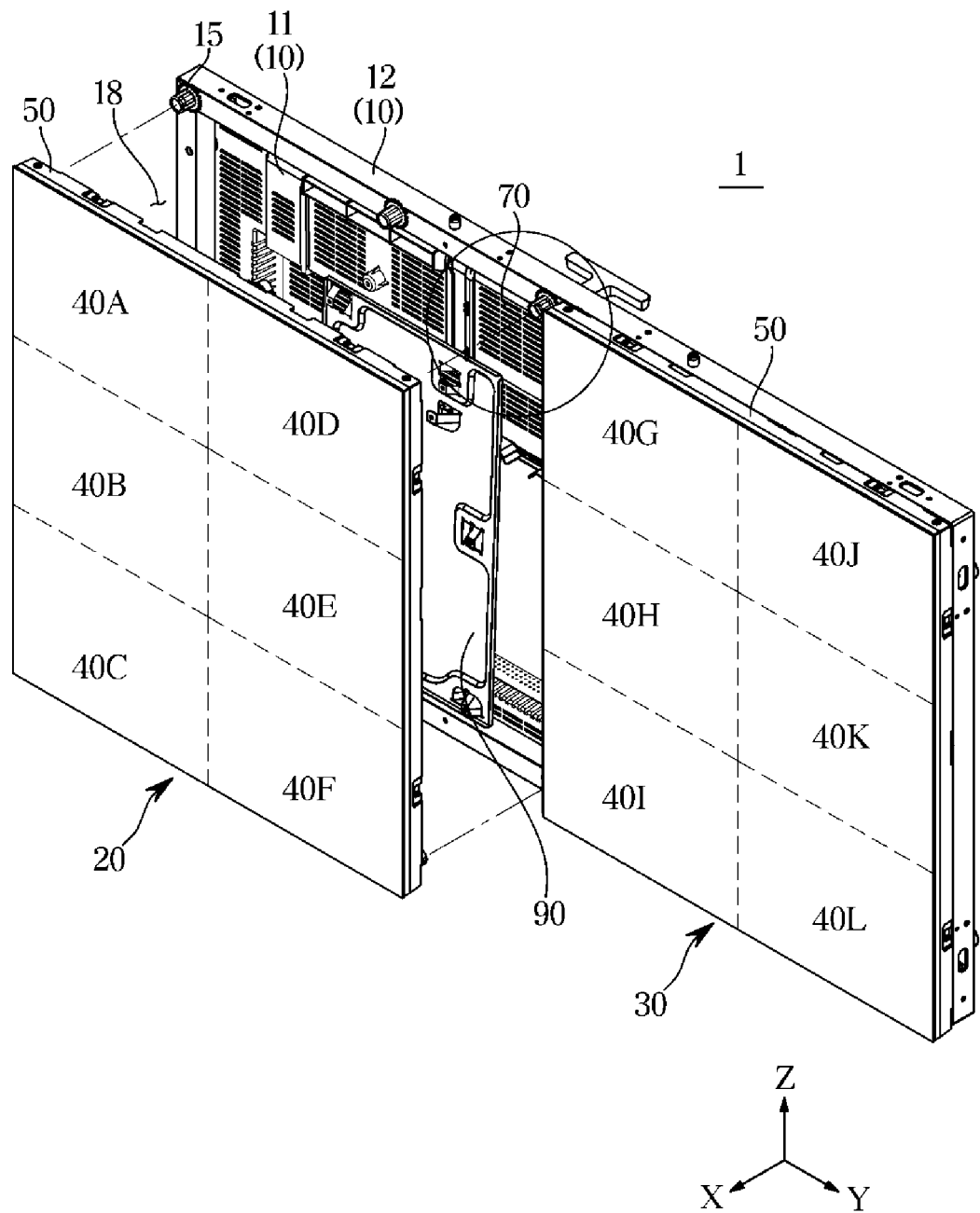

Because the coupling between the magnet 60 positioned on the main frame 10 and the magnetic material 55 positioned on the LED module assembly 20 is released, the LED module assembly 20 may be separated from the main frame 10, as shown in FIG. 7B. When the LED module assembly 20 is separated from the main frame 10, as shown in FIG. 7B, access to the accommodating space 18 is possible so that the control board 90, etc. located in the accommodating space 18 may be easily repaired or inspected.

Figure 7C:
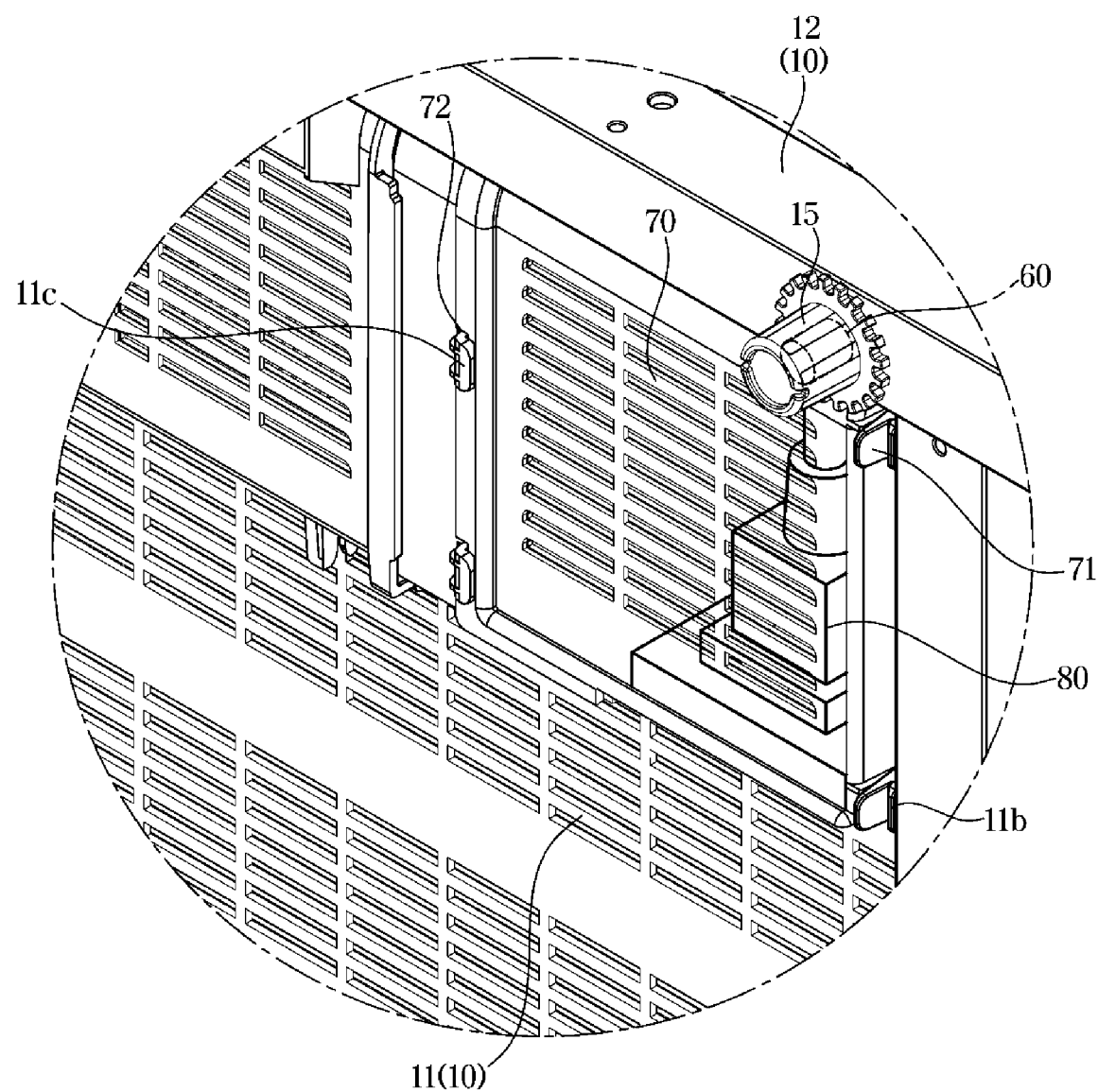

As shown in FIG. 7C, the cover 70 may be installed in the main frame body 11 to close the opening 11a formed in the main frame body 11. To access the power cable 80 behind the main frame 10, the cover 70 may need to be separated from the main frame body 11.

Figure 7D:
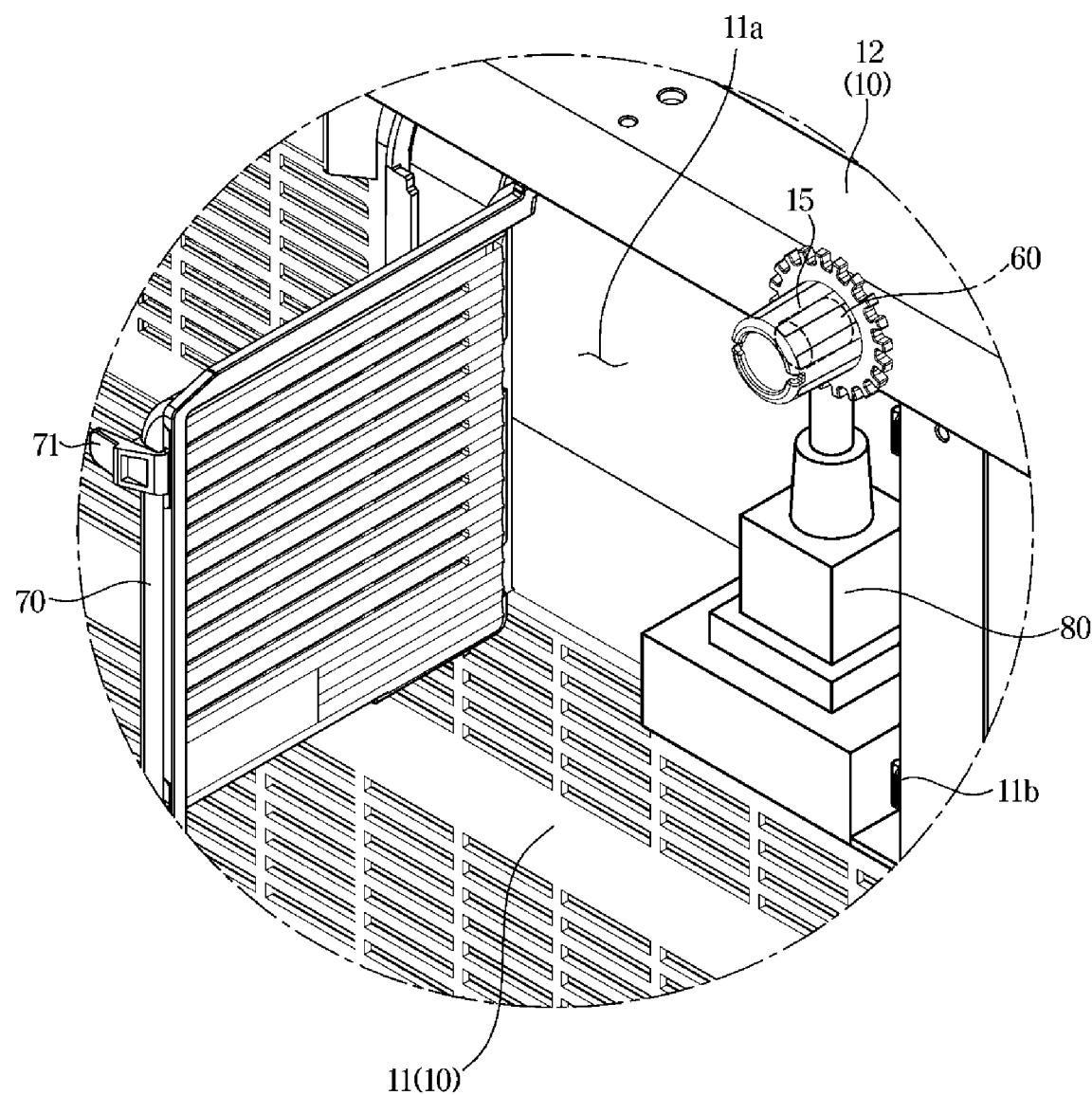
Figure 7E:
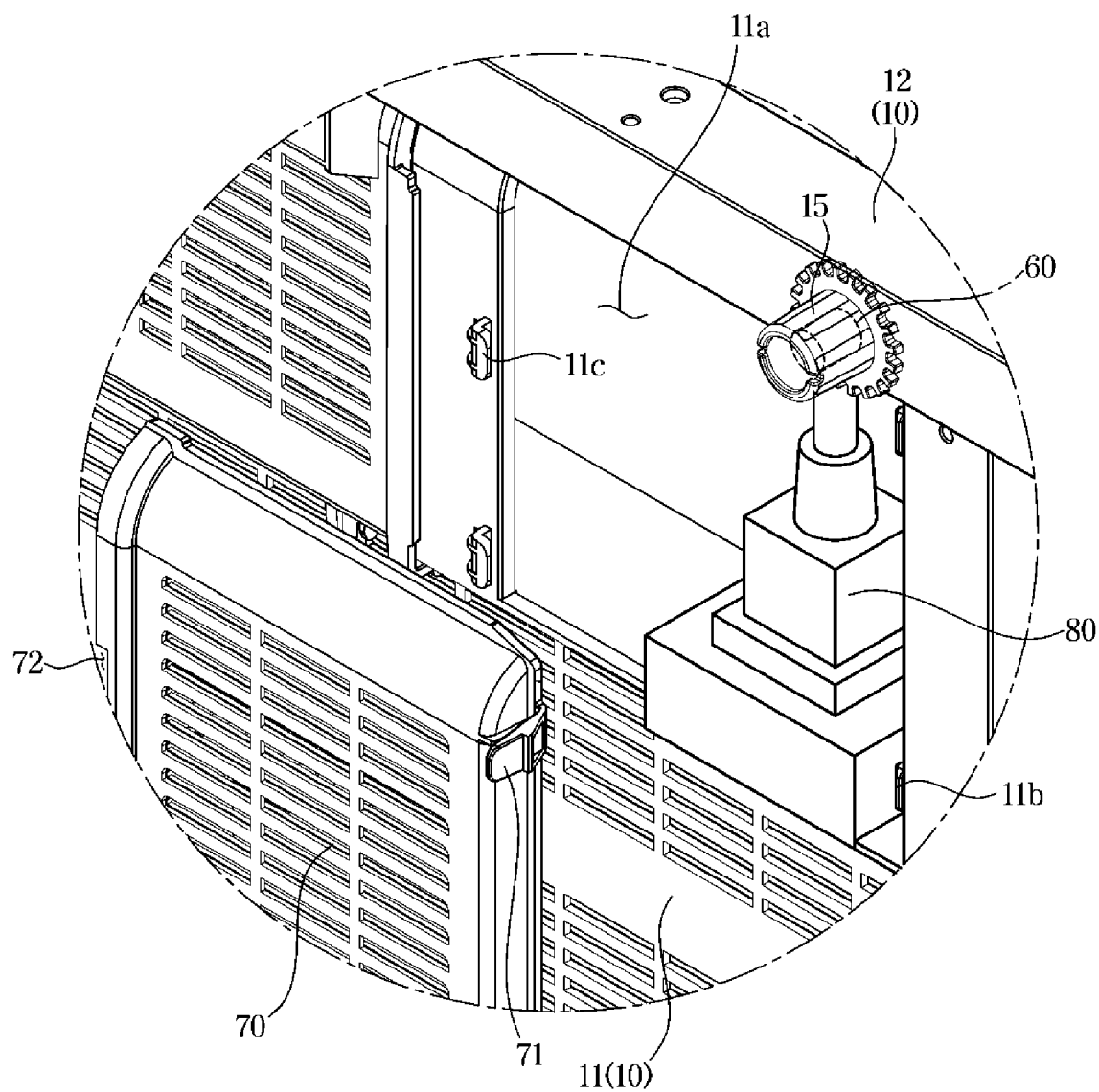

As shown in FIG. 7D, when the operating portion 71 of the cover 70 is pressed toward the inward direction of the cover 70, the operating portion 71 of the cover 70 may be separated from the locking portion 11b provided in the main frame body 11 so that one side of the cover 70 is separated from the main frame body 11. When the coupling groove 72 of the cover 70 is decoupled from the holding portion 11c provided in the main frame body 11 in the state in which one side of the cover 70 is separated from the main frame body 11, the cover 70 may be completely separated from the main frame body 11, as shown in FIG. 7E.

As shown in FIGS. 7A to 7E, by separating the plurality of LED module assemblies 20 and 30 from the main frame 10 without having to separate the display apparatus 1 from the installation surface to easily access the control board 90 located in the accommodating space 18 and separating the cover 70 from the main frame 10 to easily access the power cable 80, it may be possible to facilitate a process of inspecting or repairing the display apparatus 1. In other words, because the display apparatus 1 can be serviced from the front portion in the state in which it is installed on the installation surface, it may be unnecessary to separate the display apparatus 1 from the installation surface to completely disassemble the display apparatus 1 upon servicing of the display apparatus 1.

Figure 9A:
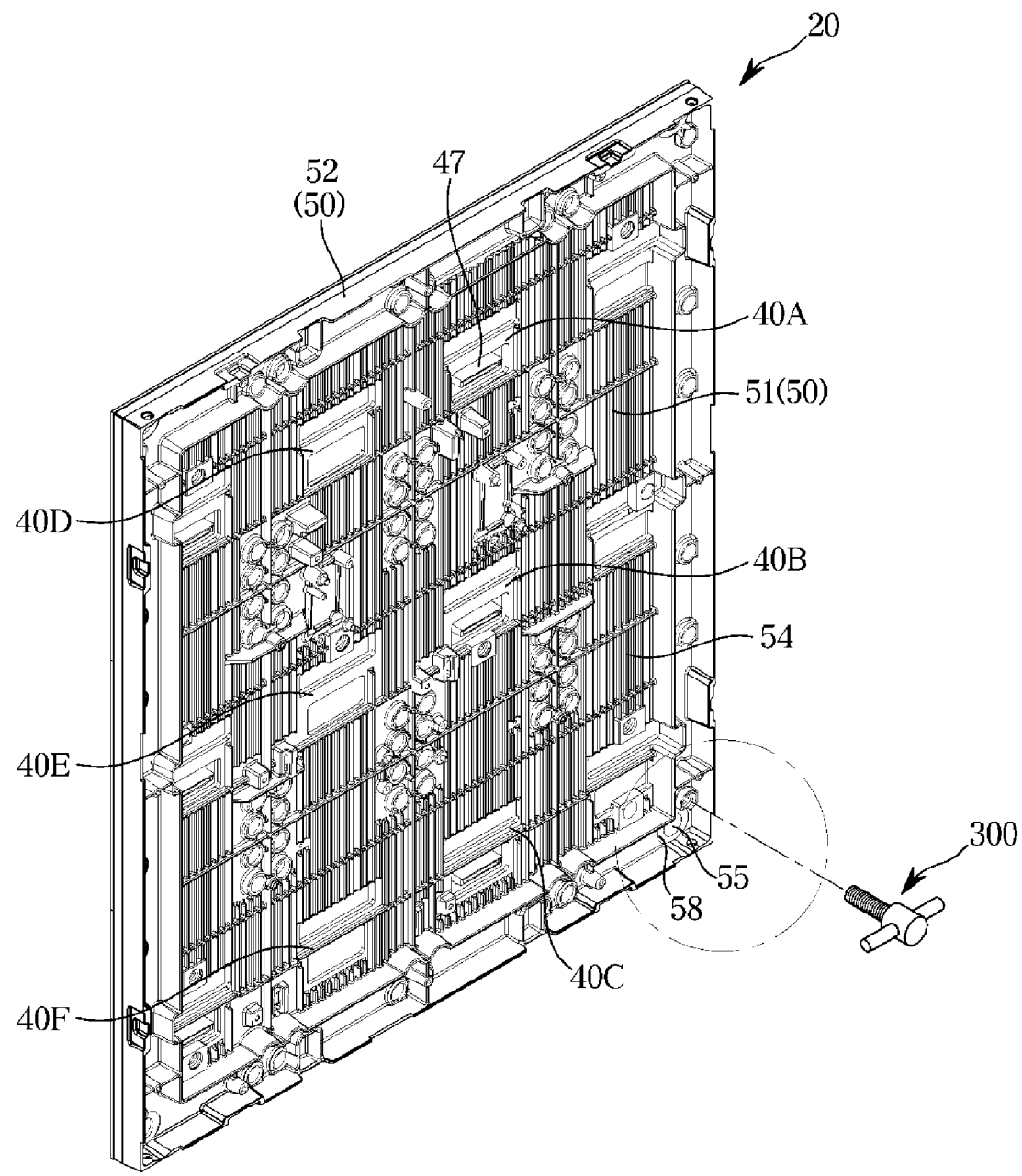
FIG. 9A shows a process of disassembling a display apparatus according to an embodiment of the present disclosure to separate a plurality of LED modules of the display apparatus from a support frame.
Figure 9B:
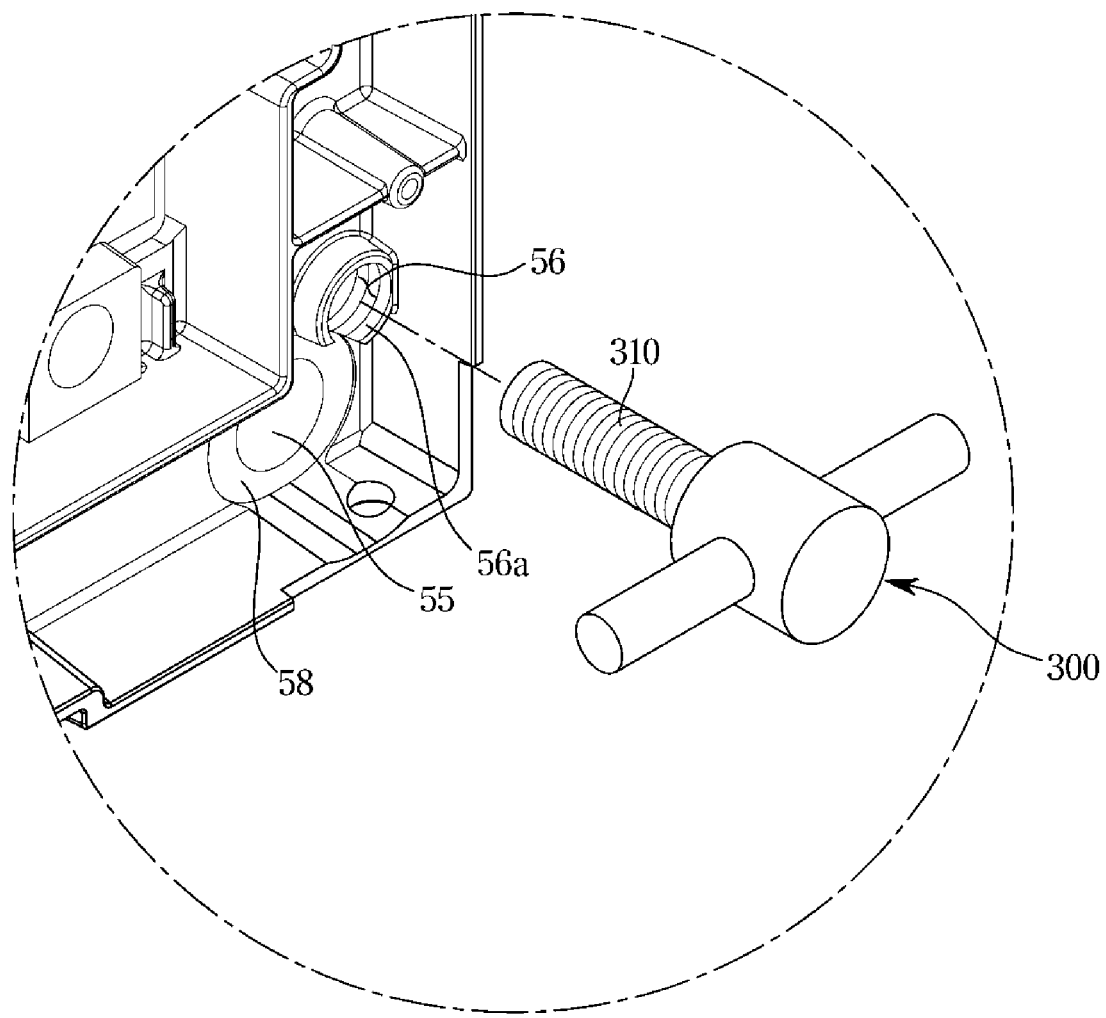
FIG. 9B is an enlarged view of an area of FIG. 9A.

FIG. 8 is a block diagram for describing a process of disassembling a display apparatus according to an embodiment of the present disclosure to separate a plurality of LED modules of the display apparatus from a support frame, and FIG. 9A shows a process of disassembling a display apparatus according to an embodiment of the present disclosure to separate a plurality of LED modules of the display apparatus from a support frame. FIG. 9B is an enlarged view of an area of FIG. 9A.

As shown in FIG. 8, a method of disassembling a display apparatus may include operation T1 of preparing a LED module assembly separated from a main frame.

The method of disassembling the display apparatus may further include operation T2 of locating the LED module assembly separated from the main frame such that a second surface of a support frame is shown, wherein the second surface of the support frame may be a rear surface of the support frame.

The method of disassembling the display apparatus may further include operation T3 of pressing a protrusion of a plurality of LED modules, which is inserted in an insertion hole of the support frame, at the second surface of the support frame, by using a pressing device. Operation T3 of pressing the protrusion of the plurality of LED modules by using the pressing device may include operation of rotating the pressing device in the state in which a first thread of the pressing device is engaged with a second thread formed in an inner circumferential surface of the insertion hole to thereby press the protrusion of the plurality of LED modules. Because the plurality of LED modules are coupled with the support frame by a coupling member, the plurality of LED modules may be separated from the support frame by pressing the protrusion of the plurality of LED modules with a greater force than a coupling force of the coupling member by using the pressing device.

The method of disassembling the display apparatus may include operation T4 of separating the plurality of LED modules from the support frame.

As shown in FIGS. 9A and 9B, the LED module assembly 20 separated from the main frame 10 may be located such that the second surface 54 of the support frame 50 is shown. In other words, the LED module assembly 20 separated from the main frame 10 may be turned over such that the second surface 54 of the support frame 50 is shown. A user may press the protrusion 45 of the plurality of LED modules 40A to 40L, inserted in the insertion hole 56 of the support frame 50, by using a pressing device 300. The pressing device 300 may be a jig. However, the kind of the pressing device 300 is not limited to a jig as long as it can press the protrusion 45 of the plurality of LED modules 40A to 40L. The pressing device 300 may include a first thread 310. In the inner circumferential surface of the insertion hole 56 of the support frame 50, the second thread 56a may be formed to correspond to the first thread 310 of the pressing device 300. The user may couple the pressing device 300 with the insertion hole 56 of the support frame 50, and then rotate the pressing device 300 in the state in which the first thread 310 of the pressing device 300 is engaged with the second thread 56a of the insertion hole 56, thereby pressing the protrusion 45 of the plurality of LED modules 40A to 40F. The plurality of LED modules 40A to 40F may be separated from the support frame 50 by a pressing force of the pressing device 300.

FIG. 10 is a block diagram for describing a process of disassembling a display apparatus according to another embodiment of the present disclosure to separate any one of a plurality of LED module assemblies from a main frame.

Hereinafter, the same components as those described above with reference to FIGS. 1 to 9B will be assigned the same reference numerals as those assigned to the corresponding components of FIGS. 1 to 9B. Hereinafter, descriptions overlapping with the above descriptions given with reference to FIGS. 1 to 9B will be omitted.

As shown in FIG. 10, a method of disassembling a display apparatus may include operation P1 of securing a gap between each of a first LED module assembly that is to be separated among a plurality of first LED module assemblies, another first LED module assembly neighboring the first LED module assembly that is to be separated, among the plurality of first LED module assemblies, and a plurality of second LED module assemblies.

The method of disassembling the display apparatus may further include operation P2 of locating a protection cover in the gap to surround at least one part of the first LED module assembly that is to be separated. Operation P2 of locating the protection cover in the gap may include operation of detachably coupling the protection cover with the other first LED module assembly neighboring the at least one part of the first LED module assembly that is to be separated, and the plurality of second LED module assemblies. Operation P2 of locating the protection cover in the gap may include operation of coupling the protection cover with the other first LED module assembly, neighboring the at least one part of the first LED module assembly that is to be separated, and the plurality of second LED module assemblies by using a magnetic force. Operation of coupling the protection cover with the other first LED module assembly, neighboring the at least one part of the first LED module assembly that is to be separated, and the plurality of second LED module assemblies may include operation of coupling a magnet of the protection cover with the protrusion of the other first LED module assembly and coupling the magnet of the protection cover with the protrusion of the plurality of second LED module assemblies to couple the protection cover with the other first LED module assembly and the plurality of second LED module assemblies such that the protection cover covers at least one part of the other first LED module assembly and at least one part of the plurality of second LED module assemblies.

The method of dissembling the display apparatus may further include operation of separating the first LED module assembly that is to be separated, from a first main frame. For example, the method of disassembling the display apparatus may include operation P3 of bringing a magnet member having ferromagnetism close to the first LED module assembly that is to be separated, to move a magnet positioned on the first main frame away from a magnetic material positioned on the first LED module assembly that is to be separated. Also, the method of disassembling the display apparatus may further include operation P4 of separating, when the magnetic material positioned on the first LED module assembly that is to be separated is separated from the magnet positioned on the first main frame, the first LED module assembly that is to be separated from the first main frame.

The method of disassembling the display apparatus may further include operation P5 of removing the protection cover. The protection cover may be removed from the gap after the first LED module assembly that is to be separated is separated from the first main frame or after the first LED module assembly is separated and then replaced with a new first LED module assembly.

Figure 12:
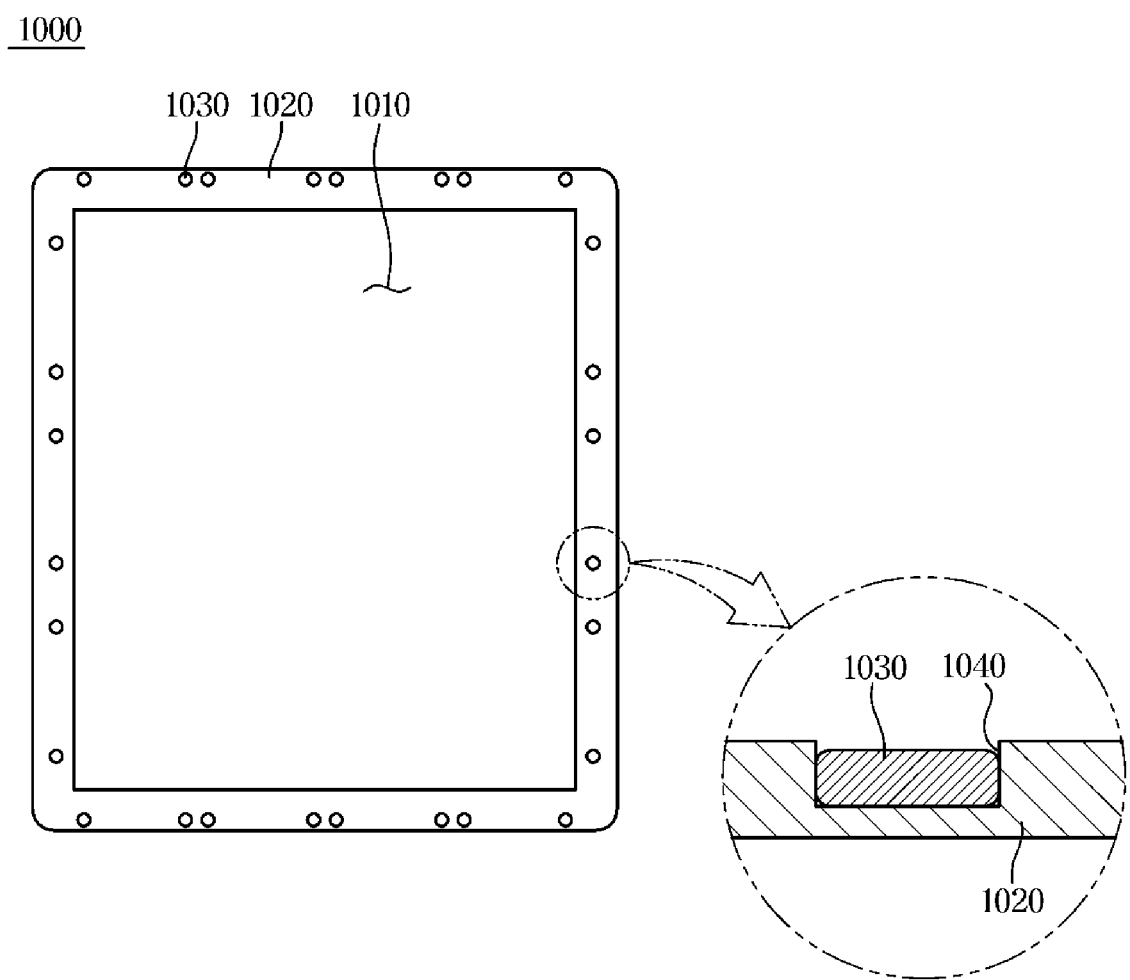
FIG. 12 shows a protection cover used in a process of disassembling the display apparatus of FIG. 10.
Figure 13:
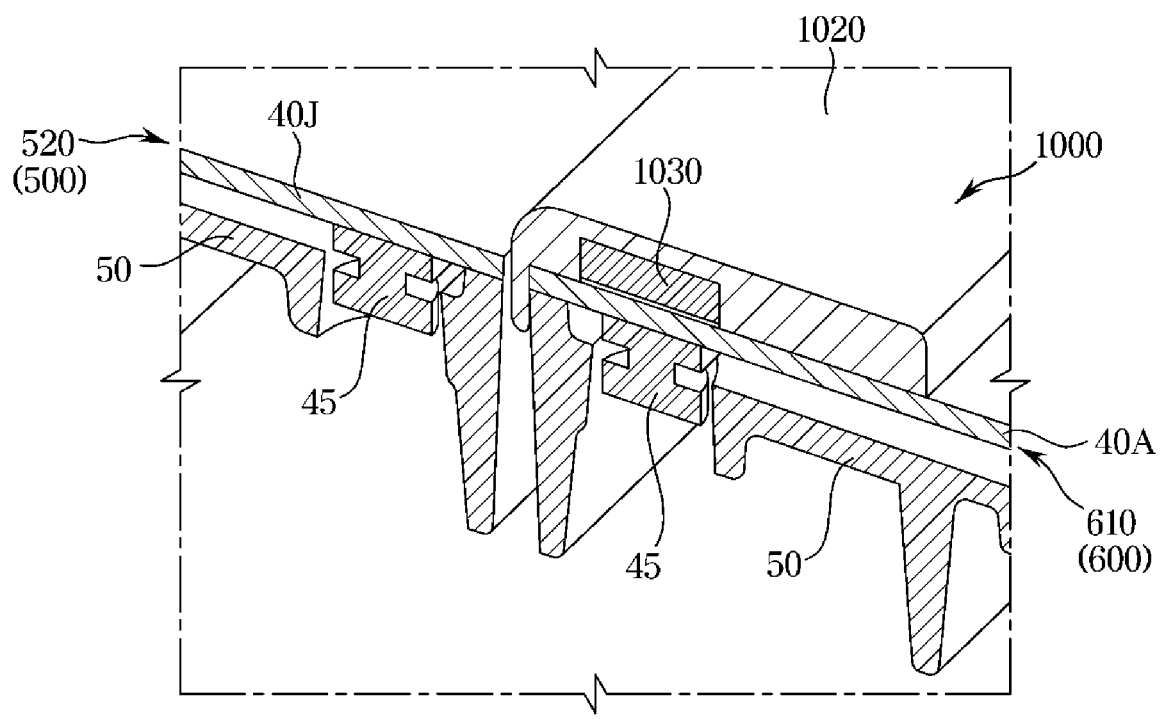
FIG. 13 shows a coupling structure between the protection cover of FIG. 12 and a plurality of LED module assemblies neighboring a LED module assembly that is to be separated.

FIG. 11 schematically shows a process of disassembling the display apparatus of FIG. 10, FIG. 12 shows a protection cover used in a process of disassembling the display apparatus of FIG. 10, and FIG. 13 shows a coupling structure between the protection cover of FIG. 12 and a plurality of LED module assemblies neighboring a LED module assembly that is to be separated.

As shown in FIGS. 11 to 13, a display apparatus 1a may include a plurality of units. The plurality of units may be arranged in the form of a M*N matrix to be adjacent to each other. In the current embodiment, 6 units may be arranged in the form of a 3*2 matrix. However, an arrangement of the plurality of units is not limited the example, and may change variously.

Each unit may include a main frame and a plurality of LED module assemblies positioned on the main frame. In the current embodiment, each unit may include a main frame and two LED module assemblies positioned on the main frame.

Hereinafter, for convenience of description, the display apparatus 1a is assumed to include a first unit 500 and a plurality of second units 600 neighboring the first unit 500.

The first unit 500 may include a first main frame 530 and a plurality of first LED module assemblies 510 and 520 positioned on the first main frame 530.

The second unit 600 may include a second main frame and a plurality of second LED module assemblies 610 and 620 positioned on the second main frame.

When the first LED module assembly 520 of the plurality of first LED module assemblies 510 and 520 of the first unit 500 is separated from the first main frame 530, a protection cover 1000 may be used to prevent the first LED module assembly 520 and LED module assemblies located around the first LED module assembly 520 from being damaged.

As shown in FIGS. 12 and 13, the protection cover 1000 may include a cavity 1010 and a plurality of edge portions 1020 defining the cavity 1010. The plurality of edge portions 1020 may be connected to each other. In other words, the plurality of edge portions 1020 may be connected to each other to form a closed loop. The protection cover 1000 may have a shape corresponding to the first LED module assembly 520 that is to be separated. For example, the protection cover 1000 may include the cavity 1010 and four edge portions 1020 defining the cavity 1010. That is, the protection cover 1000 may be in the shape of a rectangle having the cavity 1010. The first LED module assembly 520 that is to be separated may be coupled with the cavity 1010 of the protection cover 1000. More specifically, the first LED module assembly 520 that is to be separated may be coupled with the cavity 1010 of the protection cover 1000 to be positioned in the inside of the cavity 1010 of the protection cover 1000. The plurality of edge portions 1020 of the protection cover 1000 may cover the plurality of LED module assemblies 510, 610, and 620 neighboring the first LED module assembly 520 that is to be separated. More specifically, the plurality of edge portions 1020 of the protection cover 1000 may cover at least one part of the plurality of LED module assemblies 510, 610, and 620 surrounding the first LED module assembly 520 that is to be separated.

The protection cover 1000 may be made of a plastic material. However, a material forming the protection cover 1000 is not limited to plastic, and the protection cover 1000 may be made of another material.

The protection cover 1000 may further include a magnet 1030. The magnet 1030 of the protection cover 1000 may be positioned on a surface of the protection cover 1000, the surface facing the plurality of LED module assemblies 510, 610, and 620 neighboring the first LED module assembly

520 that is to be separated. Specifically, the magnet 1030 of the protection cover 1000 may be positioned on one surface of the plurality of edge portions 1020, the surface facing the plurality of LED module assemblies 510, 610, and 620 neighboring the first LED module assembly 520 that is to be separated. More specifically, the protection cover 1000 may further include a plurality of magnet accommodating portions 1040 formed in the plurality of edge portions 1020 such that the magnet 1030 is rested in each magnet accommodating portion 1040. The magnet 1030 of the protection cover 1000 may be accommodated in each magnet accommodating portion 1040 such that one surface of the magnet 1030 is exposed. The magnet 1030 of the protection cover 1000 may interact with the protrusion 45 provided in the plurality of LED module assemblies 510, 610, and 620 neighboring the first LED module assembly 520 that is to be separated, by a magnetic force. For example, the protrusion 45 may include metal reacting to the magnet 1030. The magnet 1030 of the protection cover 1000 may be detachably coupled with the protrusion 45 of the plurality of LED module assemblies 510, 610, and 620 neighboring the first LED module assembly 520 that is to be separated, with the plurality of LED modules 40A to 40L of the plurality of LED module assemblies 510, 610, and 620 in between.

To separate the first LED module assembly 520 among the plurality of first LED module assemblies 510 and 520 of the first unit 500 from the first main frame 530, a gap between each of the first LED module assembly 520, the other first LED module assembly 510 neighboring the first LED module assembly 520, and the plurality of second LED module assemblies 610 and 620 of the second unit 600 may need to be secured. For example, the gap may be about 0.5 mm. To secure the gap, the LED module assemblies 510, 610, and 620 located around the first LED module assembly 520 that is to be separated may be moved to be spaced about 2 mm from the first LED module assembly 520.

After the gap is secured, the protection cover 1000 may be positioned in the gap such that the first LED module assembly 520 that is to be separated is inserted in the cavity 1010 of the protection cover 1000. At this time, the plurality of edge portions 1020 of the protection cover 1000 may be coupled with the LED module assemblies 510, 610, and 620 located around the first LED module assembly 520 that is to be separated, to cover the LED module assemblies 510, 610, and 620 that may contact the first LED module assembly 520 when the first LED module assembly 520 is separated from the first main frame 530. As described from another aspect, a part of the protection cover 1000 may be positioned between the first LED module assembly 520 that is to be separated and the LED module assemblies 510, 610, and 620 located around the first LED module assembly 520, and the other part of the protection cover 1000 may be coupled with the LED module assemblies 510, 610, and 620 located around the first LED module assembly 520 by a magnetic force.

The first LED module assembly 520 among the plurality of first LED module assemblies 510 and 520 of the first unit 500 may be separated from the first main frame 530 of the first unit 500 without damaging the neighboring LED module assemblies 510, 610, and 620, by the protection cover 1000.

The protection cover 1000 may be removed from the neighboring LED module assemblies 510, 610, and 620, after the separated first LED module assembly 520 is inspected or repaired and then located at its original position or after the first LED module assembly 520 is replaced with a new LED module assembly.

After the protection cover 1000 is removed, the plurality of first LED module assemblies 510 and 520 of the first unit 500 and the plurality of second LED module assemblies 610 and 620 of the second unit 600 may be assembled to their original states without making any gap in between.

Figure 14:
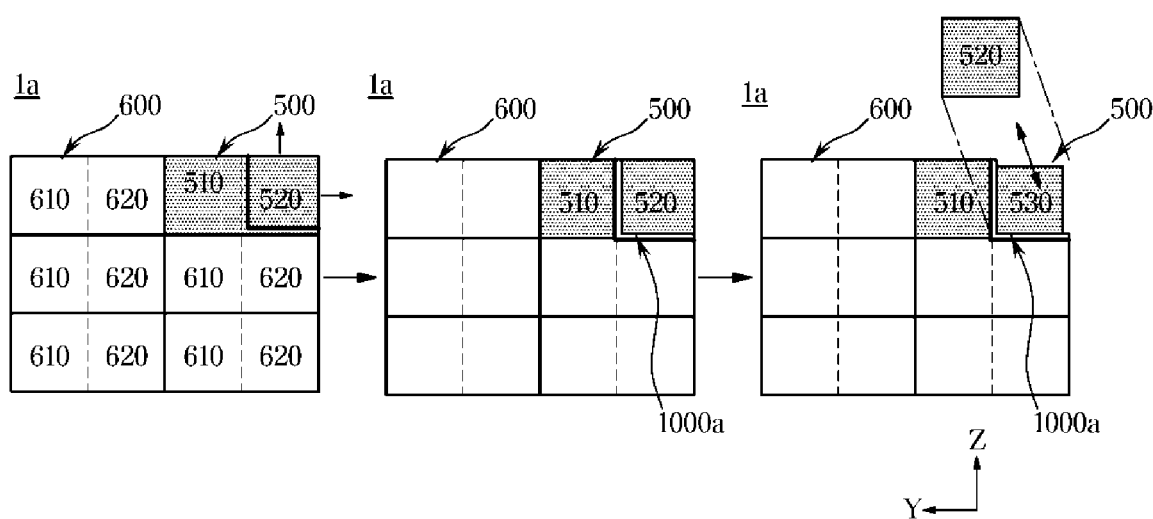
FIG. 14 schematically shows a process of separating any one of a plurality of LED module assemblies of a display apparatus according to another embodiment of the present disclosure from a main frame by using a protection cover that is different from the protection cover shown in FIG. 12.
Figure 15:
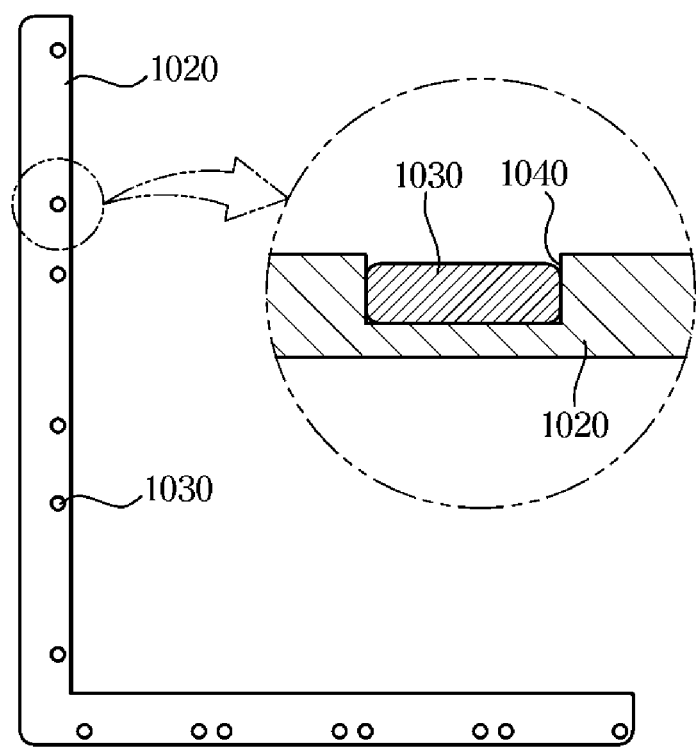
FIG. 15 is an enlarged view of the protection cover shown in FIG. 14.

FIG. 14 schematically shows a process of separating any one of a plurality of LED module assemblies of a display apparatus according to another embodiment of the present disclosure from a main frame by using a protection cover that is different from the protection cover shown in FIG. 12, and FIG. 15 is an enlarged view of the protection cover shown in FIG. 14. Hereinafter, descriptions overlapping with the above descriptions given with reference to FIGS. 11 to 13 will be omitted.

As shown in FIGS. 14 and 15, a protection cover 1000a may include two edge portions 1020. The two edge portions 1020 may be connected to each other.

The protection cover 1000a according to the current embodiment may be used when the first LED module assembly 520 that is to be separated is located at a corner of the display apparatus 1a, in other words, when the first LED module assembly 520 that is to be separated neighbors two LED module assemblies 510 and 620.

To separate the first LED module assembly 520 of the plurality of first LED module assemblies 510 and 520 of the first unit 500 from the first main frame 530, a gap between each of the first LED module assembly 520, the other first LED module assembly 510 neighboring the first LED module assembly 520, and the plurality of second LED module assemblies 610 and 620 of the second unit 600 may need to be secured.

The protection cover 1000a may be put in the gap. At this time, any one of the plurality of edge portions 1020 of the protection cover 1000a may be coupled with the other first LED module assembly 510 of the plurality of first LED module assemblies 510 and 520 of the first unit 500 to cover at least one part of the other first LED module assembly 510, and the other one of the plurality of edge portions 1020 of the protection cover 1000a may be coupled with any one LED module assembly of the plurality of LED modules 610 and 620 of the second unit 600 to cover at least one part of the LED module assembly. For example, the protection cover 1000a may be coupled with the LED module assembly 620 to cover at least one part of the LED module assembly 620. The protection cover 1000a may be detachably coupled with the plurality of LED module assemblies 510 and 620 located around the first LED module assembly 520 that is to be separated, by a magnetic force.

The first LED module assembly 520 among the plurality of first LED module assemblies 510 and 520 of the first unit 500 may be separated from the first main frame 530 of the first unit 500 without damaging the neighboring LED module assemblies 510 and 620, by the protection cover 1000a.

The protection cover 1000a may be removed from the neighboring LED module assemblies 510 and 620, after the separated first LED module assembly 520 is inspected or repaired and then located at its original position or after the first LED module assembly 520 is replaced with a new LED module assembly.

After the protection cover 1000a is removed, the plurality of first LED module assemblies 510 and 520 of the first unit 500 and the plurality of second LED module assemblies 610 and 620 of the second unit 600 may be assembled to their original states without making any gap in between.

So far, two types of protection covers have been described above, however, the protection cover may change variously.

Because coupling between the magnet positioned in the main frame and the magnetic material positioned in the LED module assembly can be released by using the magnet member having ferromagnetism, there is no need to separate the display apparatus from the installation surface and completely disassemble the display apparatus when the control board, etc. positioned in the accommodating space are inspected or repaired.

By installing the detachable cover in the main frame, it may be possible to facilitate access to the power cable.

By using the removable protection cover when the LED module assembly is separated, it may be possible to prevent the LED module assembly and LED module assemblies located around the LED module assembly from being damaged.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display apparatus comprising:
a main frame;
a magnet movably positioned on the main frame; and
a light emitting diode (LED) module assembly detachably positioned on the main frame, the LED module assembly comprising:
  a plurality of LED modules; and
  a support frame on which the plurality of LED modules are installed, the support frame comprising a magnetic material interacting with the magnet;
a power cable configured to supply power to the plurality of LED modules; and
a cover installed in the main frame to facilitate a connection of the power cable, the cover positioned between the power cable and the plurality of LED modules, and configured to be opened from a front side of the display apparatus, while the LED module assembly is detached, such as to provide an opening in the main frame, to the front side, through which the power cable is accessible from the front side.

2. The display apparatus according to claim 1, wherein the magnet and the magnetic material are disposed so that:
when the magnet moves towards the magnetic material to be coupled with the magnetic material, the LED module assembly is magnetically coupled with the main frame by a magnetic coupling force between the magnet and the magnetic material, and
when the magnet moves away from the magnetic material to be separated from the magnetic material, the LED module assembly is separated from the main frame.

3. The display apparatus according to claim 1, wherein the main frame is provided with a magnet accommodating boss which extends toward the LED module assembly, the magnet being movably accommodated within the magnet accommodating boss.

4. The display apparatus according to claim 1, wherein the LED module assembly further comprises a coupling body configured to couple the plurality of LED modules with the support frame.

5. The display apparatus according to claim 1, wherein the plurality of LED modules comprise a protrusion formed on one surface of the plurality of LED modules facing the support frame.

6. The display apparatus according to claim 5, wherein the support frame includes an insertion hole in which the protrusion is inserted.

7. The display apparatus according to claim 6, wherein a thread is formed in an inner circumferential surface of the insertion hole.

8. The display apparatus according to claim 1, wherein
the main frame comprises a locking body, and the cover comprises an operating body, formed on one side of the cover,
the operating body configured to be pressed in an inward direction of the cover such that the cover is separated from the locking body and the opening is provided, and
the operating body is exposed to the front side of the display apparatus when the LED module assembly is detached.

9. The display apparatus according to claim 8, wherein
the main frame further comprises a holding body that is configured to couple with the cover at another side of the cover, and
the cover is configured to be completely removed from the main frame, at the front side of the display apparatus, by being uncoupled from the holding body and separated from the locking body.

10. The display apparatus according to claim 1, wherein an accommodation space is defined between the main frame and LED module assembly, and
the display apparatus further comprises a control board configured to drive the plurality of LED modules, the control board positioned within the accommodation space and configured to be accessible from the front side of the display apparatus by detaching the LED module assembly from the main frame.

11. A method of disassembling a display apparatus, the display apparatus including a main frame and an LED module assembly positioned on the main frame by a magnet positioned on the main frame being magnetically coupled with a magnetic material positioned on the LED module assembly, the method comprising:
bringing a magnet member, having ferromagnetism, close to the LED module assembly coupled to the main frame such that the magnet positioned on the main frame moves away from the magnetic material positioned on the LED module assembly;
separating the LED module assembly from the main frame while the magnetic material positioned on the LED module assembly is moved away from the magnet positioned on the main frame;
separating, after the LED module assembly is separated from the main frame, a plurality of LED modules of the LED module assembly from a support frame of the LED module assembly; and
separating, toward a front side of the display apparatus after the LED module assembly is separated from the main frame, a cover from the main frame such that a power cable, that is positioned behind the main frame and that is configured to supply power to the LED module assembly, is accessible from the front side.

12. The method according to claim 11, wherein the separating the plurality of LED modules from the support frame comprises decoupling a coupling member that couples at least one of the plurality of LED modules with a front surface of the support frame.

13. The method according to claim 11, wherein the separating the plurality of LED modules from the support frame comprises pressing, with a pressing device from a rear surface of the support frame, a protrusion of at least one of the plurality of LED modules, while the protrusion is located in an insertion hole of the support frame.

14. The method according to claim 13, wherein the pressing of the protrusion of the at least one of the plurality of LED modules by using the pressing device comprises rotating the pressing device in a state in which a first thread of the pressing device is engaged with a second thread formed in an inner circumferential surface of the insertion hole to thereby press the protrusion of the at least one of the plurality of LED modules.

15. The method according to claim 11, wherein the separating of the cover from the main frame comprises pressing an operating portion formed in one side of the cover in an inward direction of the cover such that the cover is separated from a locking portion formed in the main frame.

16. The method according to claim 15, wherein the separating of the cover from the main frame further comprises separating an other side of the cover from a holding portion formed in the main frame such that the cover is completely separated from the main frame.

* * * * *